US009607112B2

(12) United States Patent
Sakaguchi et al.

(10) Patent No.: US 9,607,112 B2
(45) Date of Patent: Mar. 28, 2017

(54) CONTROLLER SUPPORT DEVICE, SIMULATION METHOD OF CONTROL PROGRAM, SUPPORT PROGRAM FOR A CONTROLLER, AND COMPUTER READABLE STORAGE MEDIUM FOR STORING THE SUPPORT PROGRAM OF THE CONTROLLER

(75) Inventors: Yasunori Sakaguchi, Fareham (GB); Kenichiro Mori, Tama (JP)

(73) Assignee: OMRON Corporation, Kyoto (JP)

( * ) Notice: Subject to any disclaimer, the term of this patent is extended or adjusted under 35 U.S.C. 154(b) by 758 days.

(21) Appl. No.: 13/634,907

(22) PCT Filed: Feb. 14, 2011

(86) PCT No.: PCT/JP2011/053032
§ 371 (c)(1),
(2), (4) Date: Nov. 26, 2012

(87) PCT Pub. No.: WO2011/114825
PCT Pub. Date: Sep. 22, 2011

(65) Prior Publication Data
US 2013/0124184 A1    May 16, 2013

(30) Foreign Application Priority Data

Mar. 15, 2010  (JP) .................................. 2010-057467

(51) Int. Cl.
G06F 9/45        (2006.01)
G06F 17/50       (2006.01)
G05B 19/4069     (2006.01)

(52) U.S. Cl.
CPC ..... G06F 17/5009 (2013.01); G05B 19/4069 (2013.01); *G05B 2219/32352* (2013.01); *Y02P 90/26* (2015.11)

(58) Field of Classification Search
CPC ............ G06F 17/5009; G05B 19/4069; G05B 2219/32352
(Continued)

(56) References Cited

U.S. PATENT DOCUMENTS 5,485,620 A * 1/1996 Sadre et al. .................. 717/162
6,889,114 B2   5/2005 Nakamura
(Continued)

FOREIGN PATENT DOCUMENTS

JP    10-011116 A     1/1998
JP    2001-209406 A   8/2001
(Continued)

OTHER PUBLICATIONS

Feldman, Stuart I. et al., "IGOR: A System for Program Debugging via Reversible Execution", 1998, ACM Sigplan Notices, vol. 24, No. 1, ACM.*
(Continued)

*Primary Examiner* — Cedric D Johnson
(74) *Attorney, Agent, or Firm* — Nutter McClennen & Fish LLP; John J. Penny, Jr.; Ashley T. Brzezinski

(57) ABSTRACT

A sequence control portion of a control program is configured to execute simulation for one period to generate an execution result related to the sequence control portion. A motion control portion is configured to execute simulation for one period to generate an execution result related to the motion control portion. A control period number is then increment updated. Whether or not a resumable control period is determined, and if determined as the resumable control period, content of a resuming data buffer (828) updated in the previous control period is saved in a resuming data storage section (826).

12 Claims, 22 Drawing Sheets

(58) Field of Classification Search
USPC .................................................. 703/13, 22
See application file for complete search history.

(56) References Cited

U.S. PATENT DOCUMENTS

| | | | |
|---|---|---|---|
| 2006/0058906 A1* | 3/2006 | Ohashi et al. | 700/182 |
| 2011/0035044 A1* | 2/2011 | Takahashi et al. | 700/178 |

FOREIGN PATENT DOCUMENTS

| | | | |
|---|---|---|---|
| JP | 2002-091523 A | | 3/2002 |
| JP | 2007-293409 A | | 11/2007 |
| JP | 2009-265943 A | | 11/2009 |
| JP | 2009265943 | * | 11/2009 |

OTHER PUBLICATIONS

Tsai, Jenn-Yuan et al., "The Superthreaded Architecture: Thread Pipelining with Run-Time Data Dependence Checking and Control Speculation", 1996, Proceedings of PACT '96, IEEE.*

Kim, Kyosun et al., "Micropreemption Synthesis: An Enabling Mechanism for Multitask VLSI Systems", Jan. 2006, IEEE Transactions on Computer-Aided Design of Integrated Circuits and Systems, vol. 25, No. 1, IEEE.*

Extended European Search Report for EP 11756015 mailed Aug. 28, 2014 (8 Pages).

International Search Report PCT/JP2011/053032, mailed Mar. 15, 2011.

* cited by examiner

CONTROLLER SUPPORT DEVICE, SIMULATION METHOD OF CONTROL PROGRAM, SUPPORT PROGRAM FOR A CONTROLLER, AND COMPUTER READABLE STORAGE MEDIUM FOR STORING THE SUPPORT PROGRAM OF THE CONTROLLER

TECHNICAL FIELD

The present invention relates to a controller support device capable of simulation of a control program including a sequence control portion and a motion control portion, executed for every control period, in a controller for controlling a movement of a machine; a simulation method of a control program; a support program for a controller; and a computer readable storage medium for storing the support program of the controller.

BACKGROUND ART

Japanese Unexamined Patent Publication No. 2001-209406 (patent document 1) describes a PLC simulator device for simulating an instruction execution of a PLC (Programmable Logic Controller) program. The PLC program is specifically a sequence program described with languages such as ladder diagram or instruction list. The PLC simulator device executes the PLC program for every instruction execution and displays the execution result. The debugging of the PLC program is thus facilitated.

Patent Document 1: Japanese Unexamined Patent Publication No. 2001-209406

DISCLOSURE OF THE INVENTION

Problems to be Solved by the Invention

Generally, an operation check of the sequence program basically includes checking that an output assumed under a predetermined input condition is obtained for every instruction execution.

As also described in patent document 1, the one-round execution may be repeated a number of times to wait for the predetermined input condition to appear. However, if the predetermined input condition appears, the operation of the instruction execution can be checked with the execution of one period.

Instead of repeating the one-round execution, the predetermined input condition may be provided through manual input or using debug program so that the operation of a certain instruction execution can be checked with the execution of one period.

In a control program including a motion control of controlling the operation of a motor by providing a command value for every control period to a motor driver for driving a servo motor, a stepping motor, and the like, the operation of the program needs to be tracked over a great number of control periods to check whether the command value to be provided to the motor driver is calculated as assumed at the time of designing.

For instance, the transition of the command value calculated ten thousand times needs to be checked to check the motor operation for ten seconds when the control period is 1 ms. In this case, in order to examine the command value of an arbitrary control period in the middle, the control program needs to be repeatedly executed from the beginning until the relevant control period is reached.

Therefore, as opposed to the case of the sequence control portion, the operation check cannot be carried out by providing the predetermined input condition and executing only the relevant control period for the motion control portion of the program. Thus, a method for operation check suited for the control program including the motion control portion needs to be newly created.

The following matters need to be taken into consideration in such a case.

In the motion control, a motion of a unit of "moving at a given speed from a current position to a target position" is connected in plurals to program a complex movement for a long period of time as a whole. In such a case, if the motion control portion of the control program is corrected or the sequence control portion that influences the start or interruption of the motion control portion is corrected to check the result, the simulation execution needs to be carried out from the beginning for a series of movements, and thus the check on the result of the program correction takes a very long time.

In addition, if the control program is such that the content of the motion control is changed according to the input from the sensor and the input from the manual switch, the input content and the input timing need to be accurately reproduced every time the simulation is re-executed, which is inconvenient.

In view of the above, the inventors found that high convenience can be realized if re-execution from the control period in the middle between the start and the end of the execution is enabled when simulating execution of the control program including the motion control.

It is an object of the present invention to provide a controller support device enabling the re-execution from the control period in the middle between the start and the end of the execution when simulating execution of the control program including the motion control, a simulation method of a control program, a support program of a controller, and a computer readable storage medium storing the support program of the controller.

Means for Solving the Problem

A controller support device according to one aspect of the present invention relates to a controller support device for simulation of a control program including a sequence control portion and a motion control portion, executed for every control period in a controller for controlling movement of a machine, the controller support device including a simulation unit for simulating execution of the control program and generating execution result data; a display data creating unit for creating display data for displaying temporal change in the execution result data generated by the simulation unit; an accepting unit for accepting an instruction of a user on the simulation unit; and a display for displaying the display data created by the display data creating unit. The simulation unit includes a sequence calculation executing part for simulating execution of the sequence control portion of the control program and generating execution result data related to the sequence control portion, a sequence variable storage part used by the sequence calculation executing part for simulation execution, a motion calculation executing part for simulating execution of the motion control portion of the control program and generating execution result data related to the motion control portion, a motion variable storage part used by the motion calculation executing part for simulation execution, a control period counting section for counting number of executions of the control period, and a resuming data storage section for saving resuming data including data of the number of executions corresponding to a resumable control period, which is a control period in which re-execution of the simulation can be started, and variable data used to start the re-execution of the simulation from the resumable control period of the data stored in the sequence variable storage part and the motion variable storage part. The simulation unit specifies the resumable control period, and stores the resuming data corresponding to the resumable control period in the resuming data storage section. The simulation unit acquires a specification for specifying the control period to start the re-execution from the accepting unit, specifies the control period to start the re-execution using the specification, and starts the re-execution of the simulation from the specified control period using the saved resuming data corresponding to the specified control period.

An control program editing unit for editing the control program is preferably further arranged. The control program editing unit can accept an operation of the user to correct the control program simulation executed in the simulation unit. The simulation unit can accept an operation of the user to start the re-execution of the simulation using the resuming data saved before the control program is corrected for the control program corrected by the control program editing unit.

In particular, the control program editing unit corrects the motion control portion of the control program by the operation of the user. The simulation unit acquires information for specifying the corrected motion control portion from the control program editing unit, specifies the control period in which re-execution can be carried out from the most recently corrected motion control portion from the resumable control periods, and starts the re-execution of the simulation from the relevant control period.

In particular, the control program editing unit list displays content of the control program on the display. The accepting unit accepts specification of the motion control portion to start the re-execution on the list display. The simulation unit specifies a control period in which re-execution can be carried out from the specified motion control portion from the resumable control periods, and starts the re-execution of the simulation from the relevant control period.

The motion control portion of the control program is preferably in either an active state which is a state of calculating a command value, or an inactive state which is not the active state, in each control period. The simulation unit specifies the resumable control period with the control period in which the motion control portion becomes the active state from the inactive state as a reference.

The motion control portion of the control program is preferably in either an executing state in which the motion control portion is in execution, or a non-executing state which is not the executing state, in each control period. The simulation unit specifies the resumable control period with the control period in which the motion control portion becomes the executing state from the non-executing state as a reference.

The simulation unit preferably specifies the control period for every constant interval as the resumable control period.

The display data creating unit preferably creates the display data for displaying the temporal change in the execution result data as a graph. The accepting unit accepts the instruction of the user on a position on the graph displayed on the display. The simulation unit specifies a control period corresponding to the position on the graph instructed by the user from the resumable control periods, and starts re-execution of the simulation from the relevant control period.

The display data creating unit preferably creates display data for displaying the temporal change in the execution result data for the position generated by the simulation unit as a trajectory in a two-dimensional space or a three-dimensional space. The accepting unit accepts the instruction of the user on the position on the trajectory. The simulation unit specifies a control period corresponding to the position on the trajectory instructed by the user from the resumable control periods, and starts re-execution of the simulation from the relevant control period.

The display data creating unit preferably creates display data for displaying the temporal change in the execution result data as a list of positions. The accepting unit accepts the instruction of the user on the position in the list of positions displayed on the display. The simulation unit specifies a control period corresponding to the position in the list of positions instructed by the user from the resumable control periods, and starts re-execution of the simulation from the control period.

A simulation method of a control program according to another aspect of the present invention relates to a simulation method of a control program for simulation in a controller support device including a display a control program, including a sequence control portion and a motion control portion, executed for every control period in a controller for controlling movement of a machine, the simulation method of the control program including the steps of simulation calculation step of simulating execution of the control program according to an instruction of a user, and generating execution result data; display data creating step of creating display data for displaying temporal change in the execution result data generated by the simulation calculation step; and display step of displaying the display data created by the display data creating step on the display. The simulation calculation step includes sequence calculation executing step of simulating execution of the sequence control portion of the control program and generating execution result data related to the sequence control portion, motion calculation executing step of simulating execution of the motion control portion of the control program and generating execution result data related to the motion control portion, control period counting step of counting number of executions of the control period, step of specifying a resumable control period, which is a control period in which re-execution of the simulation can be started; resuming data saving step of saving resuming data including the data on the number of executions corresponding to the resumable control period, and variable data used to start the re-execution of the simulation from the resumable control period of sequence variable data associated with the execution of the sequence control portion and motion variable data associated with the execution of the motion control portion; and re-execution starting step of accepting a specification by the user for specifying the control period to start the re-execution, specifying the control period to start the re-execution using the specification, and starting the re-execution of the simulation from the specified control period using the saved resuming data corresponding to the specified control period.

A support program of a controller according to another further aspect of the present invention relates to a support program of a controller for simulation in a controller support device including a display a control program, including a sequence control portion and a motion control portion, executed for every control period in a controller for controlling movement of a machine. The control program causes the controller support device to execute the steps of simulation calculation step of simulating execution of the control program according to an instruction of a user, and generating execution result data; display data creating step of creating display data for displaying temporal change in the execution result data generated by the simulation calculation step; and display step of displaying the display data created by the display data creating step on the display. The simulation calculation step includes sequence calculation executing step of simulating execution of the sequence control portion of the control program and generating execution result data related to the sequence control portion, motion calculation executing step of simulating execution of the motion control portion of the control program and generating execution result data related to the motion control portion, control period counting step of counting number of executions of the control period, step of specifying a resumable control period, which is a control period in which re-execution of the simulation can be started; resuming data saving step of saving resuming data including the data on the number of executions corresponding to the resumable control period, and variable data used to start the re-execution of the simulation from the resumable control period of sequence variable data associated with the execution of the sequence control portion and motion variable data associated with the execution of the motion control portion; and re-execution starting step of accepting a specification by the user for specifying the control period to start the re-execution, specifying the control period to start the re-execution using the specification, and starting the re-execution of the simulation from the specified control period using the saved resuming data corresponding to the specified control period.

A recording medium storing a support program of a controller according to still another further aspect of the present invention relates to a computer readable storage medium storing a support program of a controller for simulation in a controller support device including a display a control program, including a sequence control portion and a motion control portion, executed for every control period in a controller for controlling movement of a machine. The control program causes the controller support device to execute the steps of simulation calculation step of simulating execution of the control program according to an instruction of a user, and generating execution result data; display data creating step of creating display data for displaying temporal change in the execution result data generated by the simulation calculation step; and display step of displaying the display data created by the display data creating step on the display. The simulation calculation step includes sequence calculation executing step of simulating execution of the sequence control portion of the control program and generating execution result data related to the sequence control portion, motion calculation executing step of simulating execution of the motion control portion of the control program and generating execution result data related to the motion control portion, control period counting step of counting number of executions of the control period, step of specifying a resumable control period, which is a control period in which re-execution of the simulation can be started; resuming data saving step of saving resuming data including the data on the number of executions corresponding to the resumable control period, and variable data used to start the re-execution of the simulation from the resumable control period of sequence variable data associated with the execution of the sequence control portion and motion variable data associated with the execution of the motion control portion; and re-execution starting step of accepting a specification by the user for specifying the control period to start the re-execution, specifying the control period to start the re-execution using the specification, and starting the re-execution of the simulation from the specified control period using the saved resuming data corresponding to the specified control period.

Effect of the Invention

According to the present invention, when simulating execution of the control program including the motion control, the operation check of the program is facilitated since re-execution from a control period in the middle between the start and end of the execution is enabled.

BEST MODE FOR CARRYING OUT THE INVENTION

Figure 1:
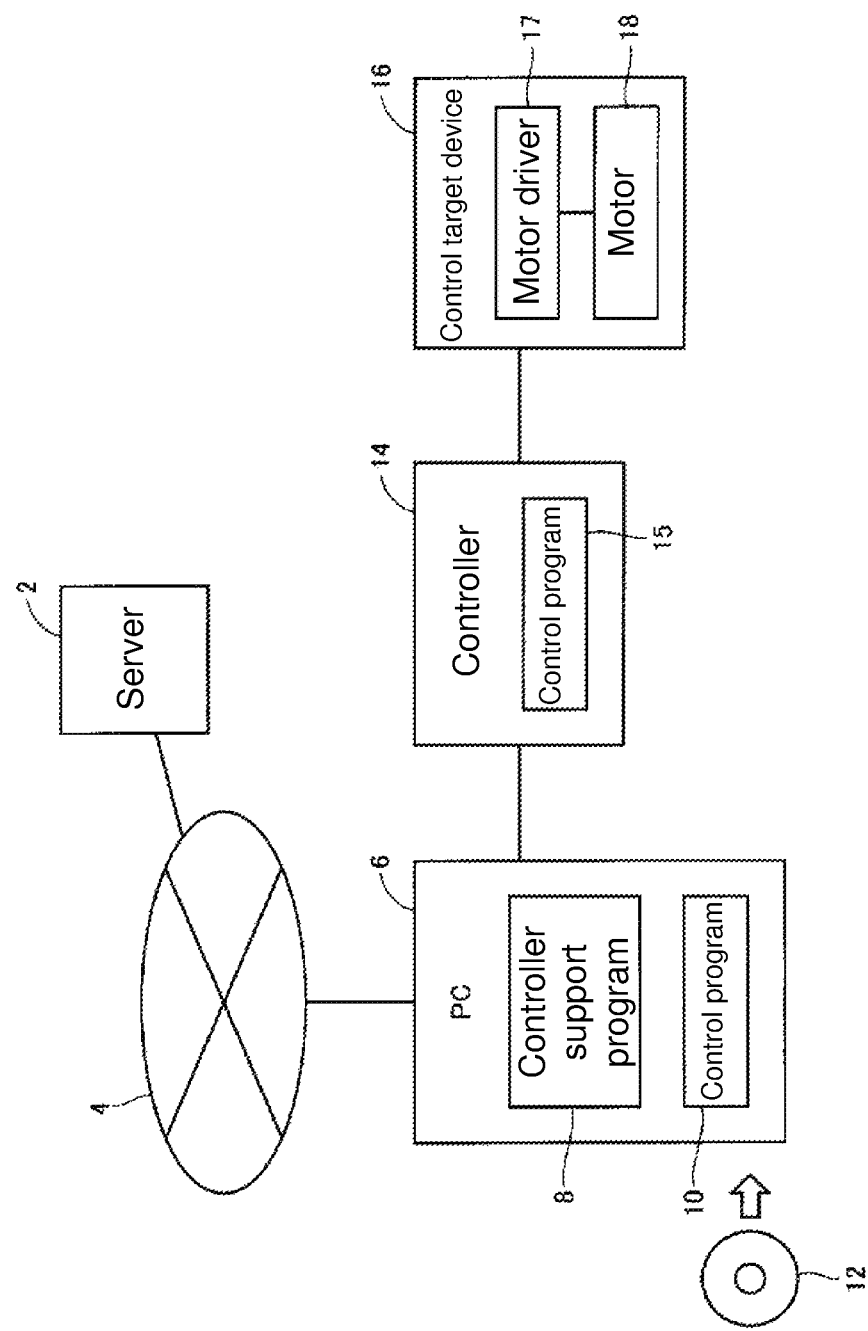
FIG. 1 is a view describing a configuration of a control system according to an embodiment of the present invention.

An embodiment of the present invention will be hereinafter described in detail with reference to the drawings. The same reference numerals are denoted on the same or corresponding portions throughout the drawings, and the description thereof will not be omitted.

FIG. 1 is a view describing a configuration of a control system according to an embodiment of the present invention.

With reference to FIG. 1, the control system according to the embodiment of the present invention is configured by a server 2, a network 4, a PC (Personal Computer) 6, a controller 14, and a control target device 16.

The server 2 is connected to the PC 6 through the network 4. The PC 6 is communicably connected to the controller 14 for controlling the control target device 16.

The PC 6 serves as a controller support device according to one embodiment of the present invention. The PC 6 is installed with a controller support program 8, and is stored with a control program 10 created by a user. A CD-ROM (Compact Disc-Read Only Memory) 12 stores the controller support program 8. The controller support program 8 installed in the PC 6 is installed from the CD-ROM 12.

The controller 14 controls the movement of the control target device 16.

In the embodiment of the present invention, a PLC (Programmable Logic Controller) is used as an example of the controller 14. In other words, the PLC has a so-called motion control function. The controller 14 stores a control program 15 defining the control content with respect to the control target device 16. The controller 14 one-round executes the control program 15 for every control period. The control program 15 stored in the controller 14 is copy data obtained by copying the control program 10 stored in the PC 6, and is transmitted from the PC 6.

The control target device 16 includes a motor 18 such as a servo motor and a stepping motor, and a motor driver 17 for driving the motor.

A drive current is supplied from the motor driver 17 to the motor 18. The motor driver 17 receives a command value of a position for every control period from the controller 14 executing the control program 15, and supplies the drive current corresponding thereto to the motor 18. If the motor 18 is a servo motor, the motor 18 includes an encoder, and an actual measured value of the rotation position of the motor 18 is detected by the encoder. The actual measured value of the rotation position of the motor is used for feedback control by the motor driver 17.

In the above description, a case of installing the controller support program in the PC 6 through the CD-ROM 12 has been described, but is not particularly limited thereto, and the controller support program may be downloaded from the server 2 to the PC 6 through the network 4. This is the same for the control program as well.

Figure 2:
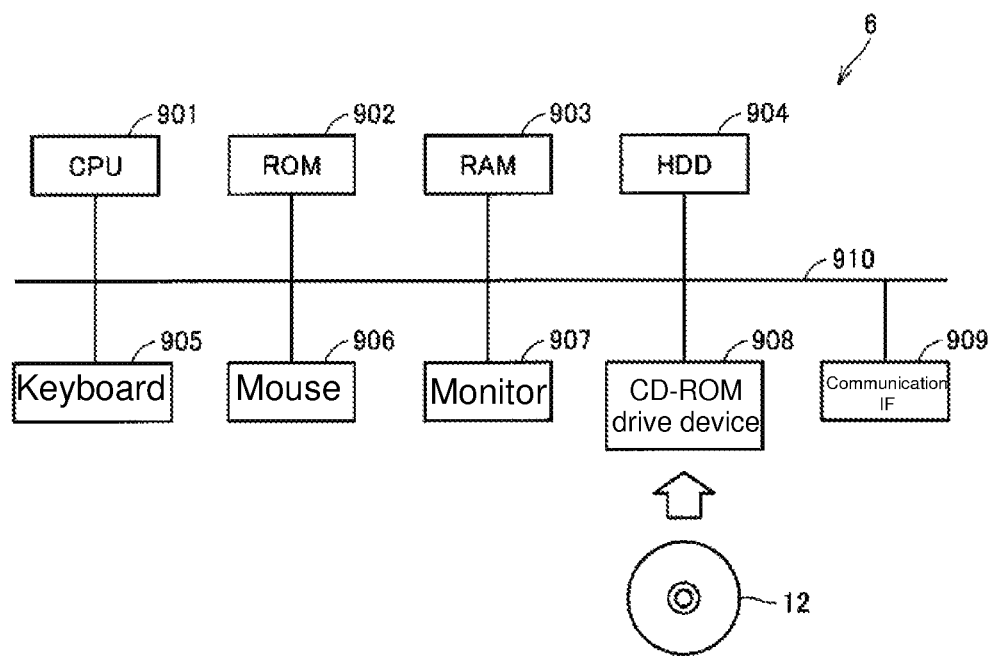
FIG. 2 is a view describing a hardware configuration of a PC 6 according to the embodiment of the present invention.

FIG. 2 is a view describing a hardware configuration of the PC 6 according to the embodiment of the present invention.

With reference to FIG. 2, the PC 6 according to the embodiment of the present invention includes a CPU 901, which is a processing means, a ROM 902, a RAM 903, and a HDD 904, which are storage means, a CD-ROM driving device 908, which is a data reading unit, a communication IF 909, which is a communication means, a monitor 907, which is a display means, and a keyboard 905 and a mouse 906, which are input means. Such units are connected to each other by way of an internal bus 910.

The HDD 904 is typically a non-volatile magnetic memory, and stores the controller support program read from the CD-ROM 12 by the CD-ROM driving device 908. The HDD 904 also stores the control program 15.

The CPU 901 develops the controller support program 8 according to the present embodiment stored in the HDD 904 to the RAM 903, and the like, and executes the same.

The RAM 903 is a volatile memory and is used as a work memory. The ROM 902 generally stores program such as operating system (OS: Operating System), and the like.

The communication IF 909 typically supports a universal communication protocol such as Ethernet (registered trademark) and USB (Universal Serial Bus), and provides data communication with the server 2 through the network 4 and provides data communication with the controller 14.

The monitor 907 is configured by a liquid crystal display device, a CRT (Cathode Ray Tube), a plasma display device, and the like, and displays processing results and the like by the PC 6. The keyboard 905 accepts the key input by the user, and the mouse 906 accepts the pointing operation by the user.

Figure 3:
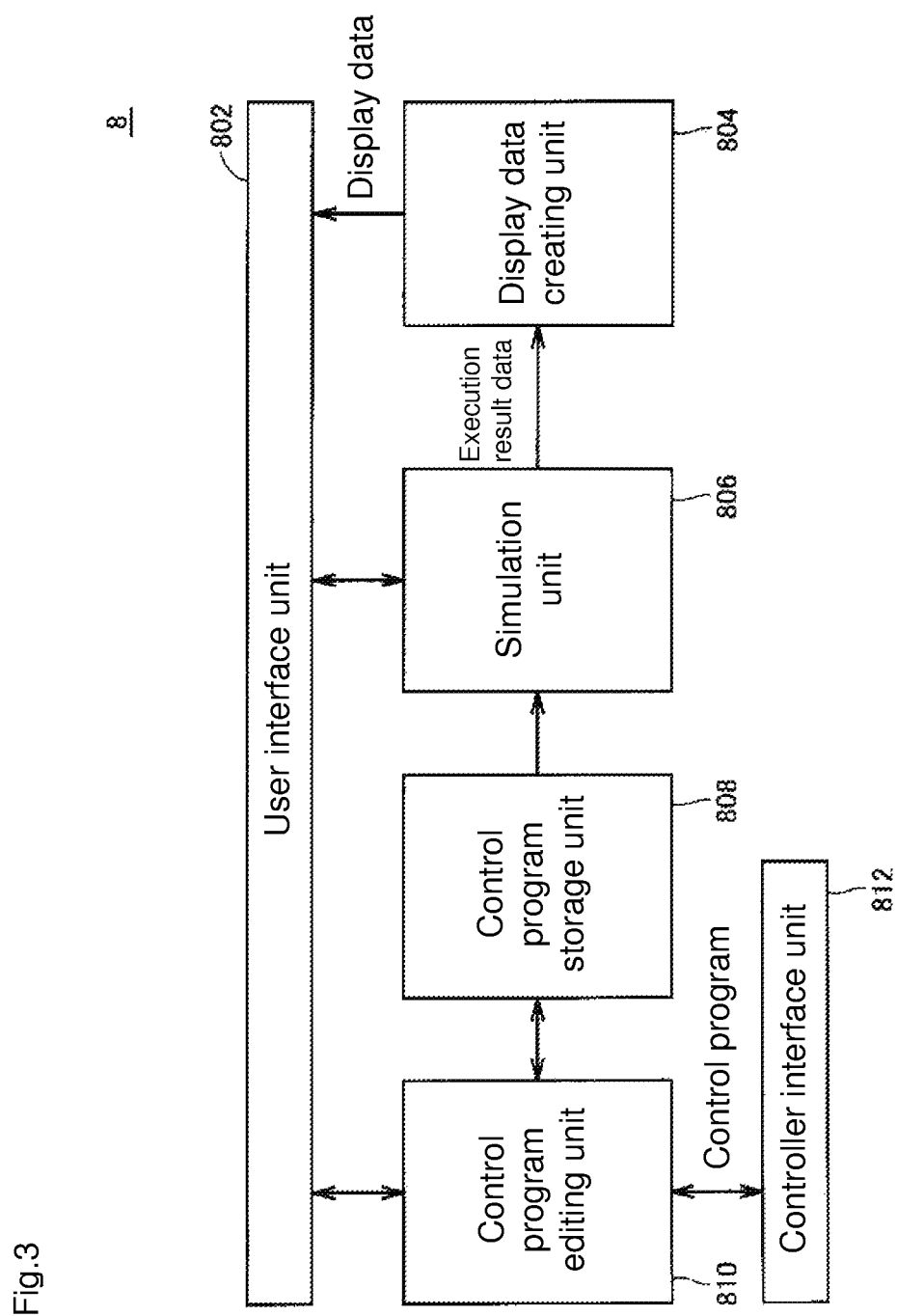
FIG. 3 is a view describing function blocks realized when a CPU 901 executes a controller support program 8.

FIG. 3 is a view describing function blocks realized when the CPU 901 executes the controller support program 8.

With reference to FIG. 3, a user interface unit 802, a display data creating unit 804, a simulation unit 806, a control program storage unit 808, a control program editing unit 810, and a controller interface unit 812 are shown.

The user interface unit 802 is a unit for creating the content of a window screen to display on the monitor 907 of the PC 6, and accepting the operation of the user by the keyboard 905 and the mouse 906.

The control program editing unit 810 enables the user to input and edit the control program. If compiling is necessary to execute the control program, the compiling is also carried out. The created control program is sent to the controller 14 through the controller interface unit 812. The created control program is stored in the control program storage unit 808, which is a predetermined region of the HDD 904. The control program editing unit 810 reads out the control program 15 stored in the controller 14 through the controller interface unit 812 and edits the same.

The simulation unit 806 is a simulator of the controller 14. The simulation unit 806 simulates the operation in which the controller 14 executes the control program 15 according to the control program 10 stored in the control program storage unit 808, and calculates the command value of the position which the controller 14 is to output for every control period.

The simulation unit 806 can also simulate the state in which the signal arrives from outside and influences the operation of the control program, or can simulate the state in which the internal state of the controller 14 such as the storage content of the memory of the controller 14 is changed by the execution itself of the control program 15 and such change influences the operation of the control program 15.

The simulation unit 806 accepts an instruction of the user related to the simulation execution through the user interface unit 802. In other words, the user interface unit 802 also serves as a means for accepting the instruction of the user with respect to the simulation unit 806.

The display data creating unit 804 creates display data for displaying temporal change in the execution result data created by the simulation unit 806. The display data creating unit 804 sends the created display data to the user interface unit 802 to display the display data on the monitor 907 of the PC 6 in a form of graphs and characters.

Figure 4:
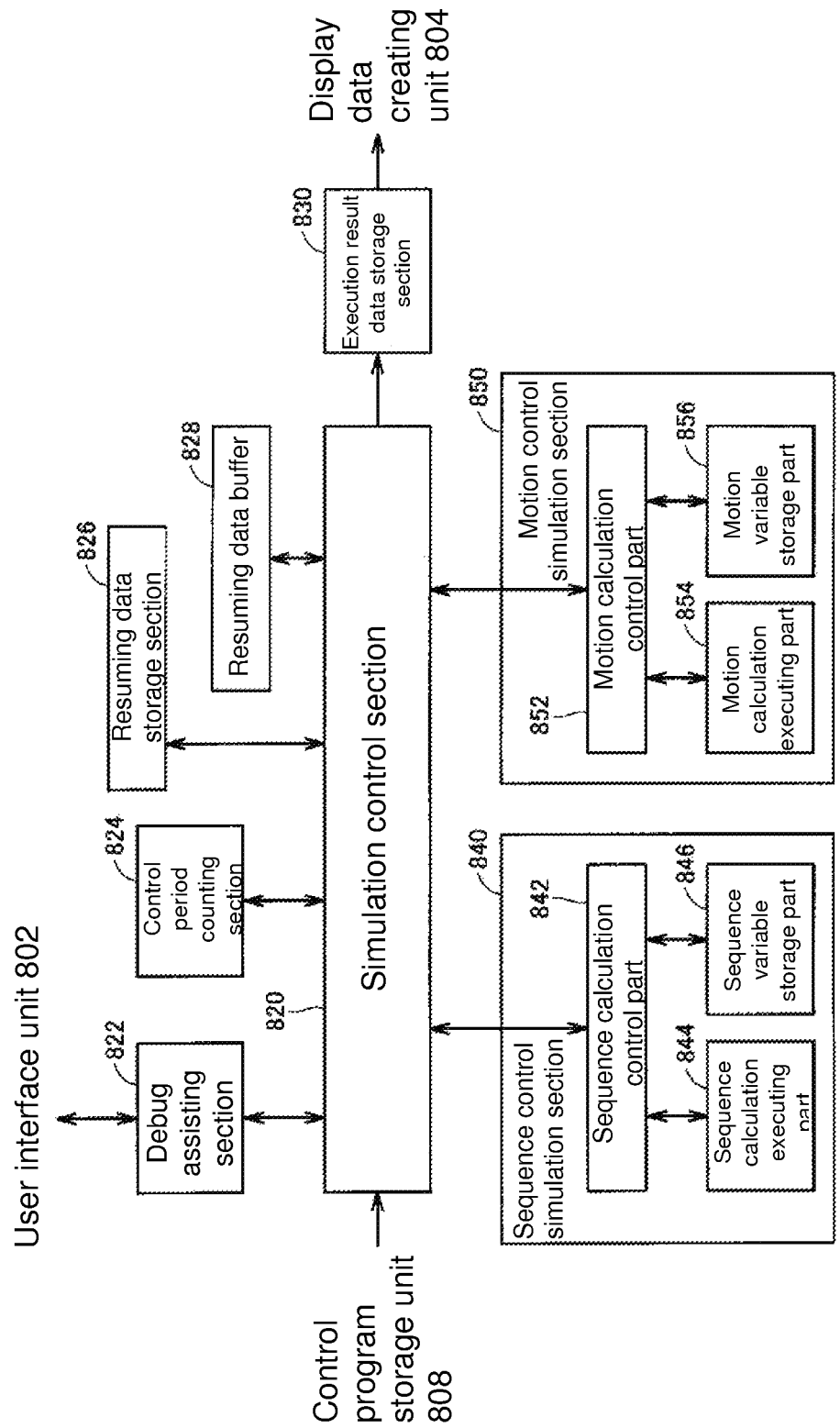
FIG. 4 is a detailed block diagram describing a function of a simulation unit 806 according to the embodiment of the present invention.

FIG. 4 is a detailed block diagram describing the functions of the simulation unit 806 according to the embodiment of the present invention.

With reference to FIG. 4, the simulation unit 806 according to the embodiment of the present invention includes a simulation control section 820, a debug assisting section 822, a control period counting section 824, a resuming data storage section 826, a resuming data buffer 828, an execution result data storage section 830, a sequence control simulation section 840, and a motion control simulation section 850. The resuming data storage section 826, the resuming data buffer 828, and the execution result data storage section 830 are respectively uses a predetermined region of the RAM 903 or the HDD 904.

The simulation control section 820 reads the control program 10 from the control program storage unit 808, simulation executes and re-executes from the middle the control program 10, and accompanied therewith, controls the flow of data among the sequence control simulation section 840, the motion control simulation section 850, the control period counting section 824, the resuming data buffer 828, the resuming data storage section 826, and the execution result data storage section 830. The specific flow of data will be described later.

The sequence control simulation section 840 executes the sequence control portion of the control program 10.

The motion control simulation section 850 executes the motion control portion of the control program 10.

The motion control portion of the control program 10 is the portion for calculating the command value to be provided to the motor driver 17 for every control period. The motion control portion is, for example, described in a form of a motion function block used in the ladder chart. Hereinafter, the motion function block is sometimes described simply as FB.

The sequence control portion of the control program 10 refers to the portion other than the motion control portion of the control program 10. The sequence control portion also includes a numerical value calculating instruction or numerical value calculation function block in addition to the relay sequence portion of the ladder chart.

The sequence control simulation section 840 includes a sequence calculation executing part 844, a sequence variable storage part 846, and a sequence calculation control part 842.

The sequence calculation control part 842 controls the execution of the sequence control portion.

The sequence calculation executing part 844 simulation executes the sequence control portion of the control program according to the instruction of the sequence calculation control part 842, and generates execution result data related to the sequence control portion.

The sequence variable storage part 846 stores the sequence variable related to the execution of the sequence control portion according to the instruction of the sequence calculation control part 842. The sequence variable storage part 846 uses a predetermined region of the RAM 903 or the HDD 904.

The motion control simulation section 850 includes a motion calculation executing part 854, a motion variable storage part 856, and a motion calculation control part 852.

The motion calculation control part 852 controls the execution of the motion control portion.

The motion calculation executing part 854 simulation executes the motion control portion of the control program according to the instruction of the motion calculation control part 852, and generates execution result data related to the motion control portion.

The motion variable storage part 856 stores the motion variable related to the execution of the motion control portion according to the instruction of the motion calculation control part 852. The motion variable storage part 856 uses a predetermined region of the RAM 903 or the HDD 904.

The control period counting section 824 counts the number of executions of the control period.

The resuming data buffer 828 temporarily saves the data of the type saved in the resuming data storage section 826 for each control period.

The resuming data storage section 826 saves the resuming data necessary to start re-execution from the middle of the simulation after the simulation is executed at least once. The data to be saved is the data temporarily saved in the resuming data buffer 828. The resuming data includes the following three types of data.

First is the data of the number of executions of the control period corresponding to the resumable control period in which the re-execution of the simulation can be started.

Second is the sequence variable data used to start the re-execution of the simulation from the resumable control period of the data stored in the sequence variable storage part 846.

Third is the motion variable data used to start the re-execution of the simulation from the resumable control period of the data stored in the motion variable storage part 856.

The execution result data storage section 830 stores the execution result data used for the display.

The debug assisting section 822 provides functions used in debugging such as setting of the break point, which is an area to temporarily stop the simulation in the middle of the control program, setting of the step execution to temporarily stop every time the control program is executed one step, and the like. The debug assisting section 822 causes the simulation control section 820 to perform the operation based on the instruction of the user upon receiving the instruction of the user related to the execution of the simulation and the re-execution from the middle, and other debug functions through the user interface unit 802.

When each section configuring the simulation unit 806 cooperatively operates, the simulation unit 806 acquires the specification for specifying the control period to start the re-execution through the user interface unit 802, specifies the control period to start the re-execution using such specification, and uses the resuming data corresponding to the specified control period to start the re-execution of the simulation from the specified control period.

Figure 5:
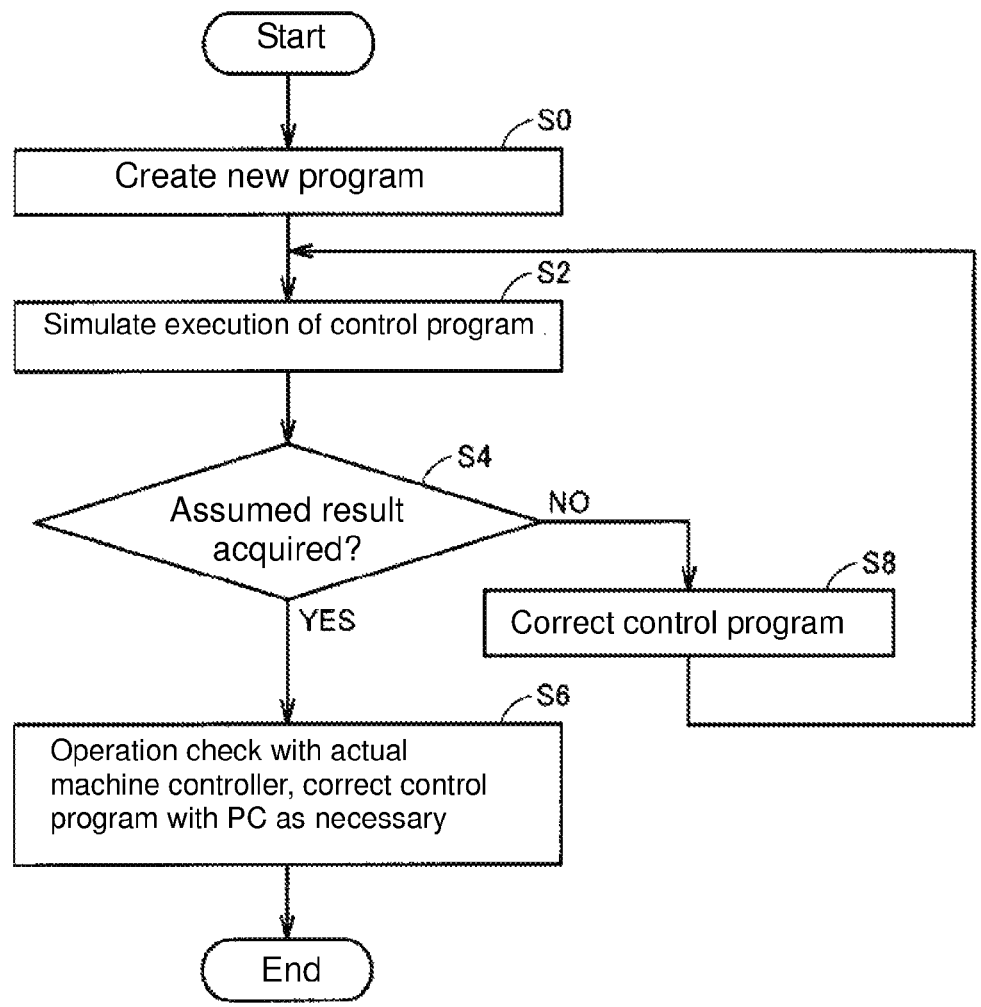
FIG. 5 is a flowchart describing a debug operation of the control program according to the embodiment of the present invention.

FIG. 5 is a flowchart describing a debug operation of the control program according to the embodiment of the present invention.

With reference to FIG. 5, first, the control program is created (step S0). The control program is then simulation executed (step S2). Whether or not the assumed result is acquired is then determined (step S4). If determined that the assumed result is acquired in step S4, the process proceeds to step S6, operation check is carried out with the controller 14, which is an actual machine, and the control program is corrected in the PC 6 according to the controller support program 8, as necessary. The process is then terminated.

If determined that the assumed result is not acquired in step S4 (NO in step S4), the control program is corrected (step S8). The process again returns to S2, and the simulation execution is carried out based on the corrected control program. The subsequent processes are similar to the above, and thus the detailed description will not be repeated. The control program in which the assumed result is acquired is stored in the control program storage unit 808.

Figure 6:
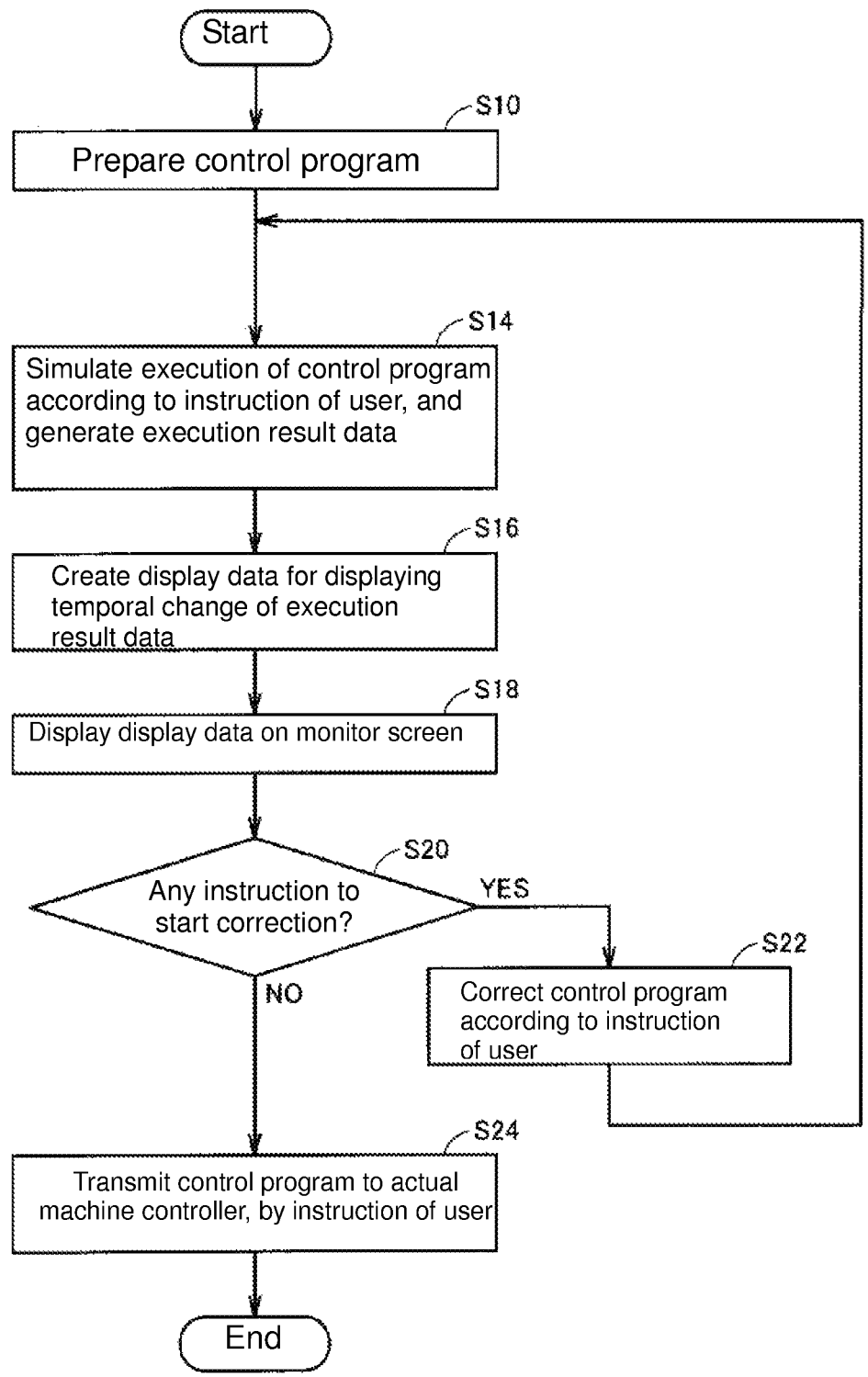
FIG. 6 is a flowchart describing the execution of the controller support program 8 according to the embodiment of the present invention.

FIG. 6 is a flowchart describing the execution of the controller support program 8 according to the embodiment of the present invention.

With reference to FIG. 6, first, the control program 10 is prepared (step S10). There are various methods for preparing the control program 10. For instance, the control program created by new input and stored in the control program storage unit 808 as described in FIG. 5 can be used. Alternatively, the control program can be read from a storage medium (CD-ROM 12) or from the server 2 through the network 4. Alternatively, the control program may be read from the controller 14, which is the actual machine.

The simulation unit 806 simulation executes the control program 10 according to the instruction of the user, and generates the execution result data (step S14).

The display data creating unit 804 creates display data for displaying temporal change in the execution result data (step S16).

The user interface unit 802 then displays the display data on the monitor 907 (step S18).

The control program editing unit 810 then determines whether an instruction to start the correction is made (step S20). Specifically, the control program editing unit 810 determines whether an instruction to start the correction is made from the user through the user interface unit 802.

If determined that the instruction to start the correction is made from the user through the user interface unit 802 in step S20 (YES in step S20), the control program editing unit 810 corrects the control program according to the instruction of the user (step S22). The process again returns to step S12, and the control program is simulation executed by the instruction of the user (step S12). The subsequent processes are the same.

If determined that the instruction to start the correction is not made in step S20 (NO in step S20), the control program editing unit 810 transmits the control program to the controller 14, which is the actual machine, by the instruction of the user (step S24). The process is then terminated.

The specific contents of the process of simulating execution of the control program according to the instruction of the user in step S12 of FIG. 6 and the process of generating the execution result data in step S14 will now be described.

Figure 7:
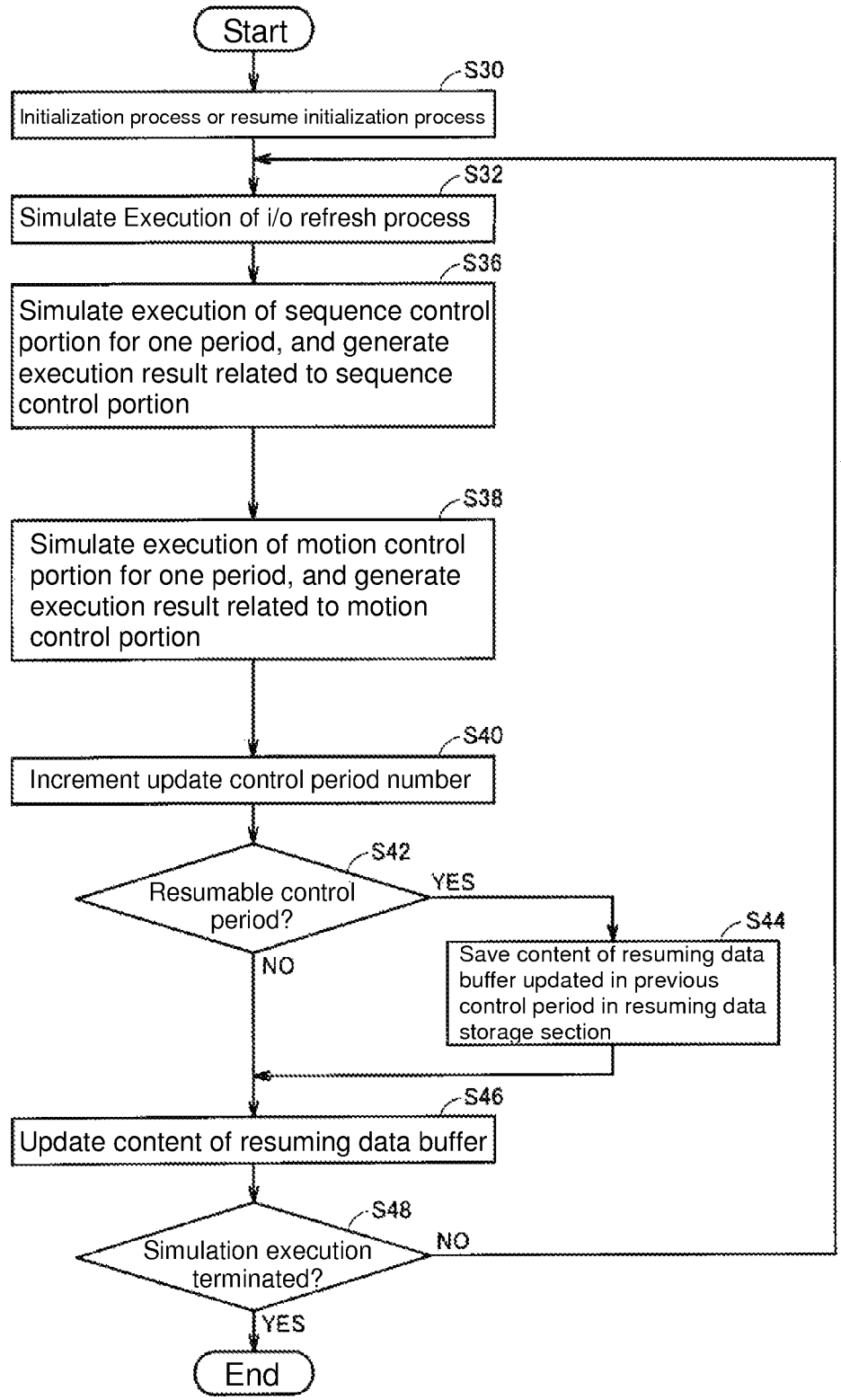
FIG. 7 is a flowchart describing the simulation execution in the simulation unit 806 according to the embodiment of the present invention.

FIG. 7 is a flowchart describing the simulation execution in the simulation unit 806 according to the embodiment of the present invention.

With reference to FIG. 7, first, the simulation control section 820 executes an initialization process or a resume initialization process (step S30). The "initialization process" refers to the process of initializing the values of the variables and the like when executing the control program from the first control period. The "resume initialization process" refers to the process of reading the resuming data from the resuming data storage section 826 and preparing to start the re-execution of the simulation using the same when re-executing the control program from the control period in the middle.

The simulation control section 820 executes the simulation of an I/O refresh process (step S32). The "I/O refresh process" includes an output process and an input process.

The output process is a process of outputting the execution result data in the previous period.

The output process includes a process of outputting output variable data, which is the execution result of the sequence control portion of the control program, and a process of outputting the command value, which is the execution result of the motion control portion of the control program.

In the actual controller 14, the output variable data is transmitted to the control target device 16 through the I/O unit, and used for the driving of the actuator, and the like. The command value is transmitted to the motor driver 17, and used for the control of the motor 18 of the control target device 16. However, in the case of the simulation execution, the execution result data is not actually transmitted to the control target device 16, and one part of the execution result data is stored in the execution result data storage section 830.

The input process is a process of retrieving input variable data to be used by the sequence control portion, position data to be used by the motion control portion, and the like. In the case of the simulation execution, the input variable data may be manually provided by the user or may be provided by the debug program that copies the operation of the control target device. The command value of the position in the previous period can be adopted as is for the position data.

The sequence control simulation section 840 then simulation executes the sequence control portion of the control program for one period, and generates the execution result related to the sequence control portion (step S36).

The motion control simulation section 850 simulates the execution of the motion control portion for one period, and generates the execution result related to the motion control portion (step S38).

The simulation control section 820 then increment updates the control period number (step S40).

The simulation control section 820 then determines whether the control period in execution is a resumable control period (step S42). In other words, if the control period in execution matches the specified conditions of the resumable control period such as "Active ON of FB", "Busy ON of FB", and "constant interval", to be described later, the control period in execution is determined as the resumable control period. The resumable control period is specified from a series of control periods according to such determination. If the condition of the resumable control period is "constant interval", the resumable control period can be specified by preparing a list of control periods, which are the resumable control periods, in advance. In such a case, whether or not the control period in execution is the resumable control period is determined by checking with the relevant list.

If determined as the resumable control period in step S42 (YES in step S42), the simulation control section 820 saves the content of the resuming data buffer 828 updated in the previous control period in the resuming data storage section 826 (step S44).

The process then proceeds to step S46.

If determined as not the resumable control period in step S42 (NO in step S42), the simulation control section 820 updates the content of the resuming data buffer 828 based on the execution result generated in the sequence control simulation section 840 and the motion control simulation section 850 (step S46).

The simulation control section 820 then determines whether or not the simulation execution is terminated (step S48).

If determined that the simulation execution is terminated in step S48, the simulation control section 820 terminates the process.

If determined that the simulation execution is not terminated in step S48 (NO in step S48), the simulation control section 820 returns to step S32, and executes the simulation of the I/O refresh in step S32 according to the next control period number that is increment updated. The above processes are repeated until the simulation execution is terminated.

As shown in FIG. 6, in the controller support program according to the present embodiment, the control program editing unit 810 can accept the operation of the user to correct the control program that has been simulated in the simulation unit 806.

As shown in FIG. 7, the simulation unit 806 can accept the operation of the user to start the re-execution of the simulation using the resuming data saved before the control program is corrected for the control program corrected by the control program editing unit 810.

Therefore, the operation of the portion of the control program subjected to the influence of correction can be rapidly checked by having the user specify the control period before the control period in which the portion of the control program where the execution result is influenced by the correction is executed to start the re-execution of the simulation.

Figure 8:
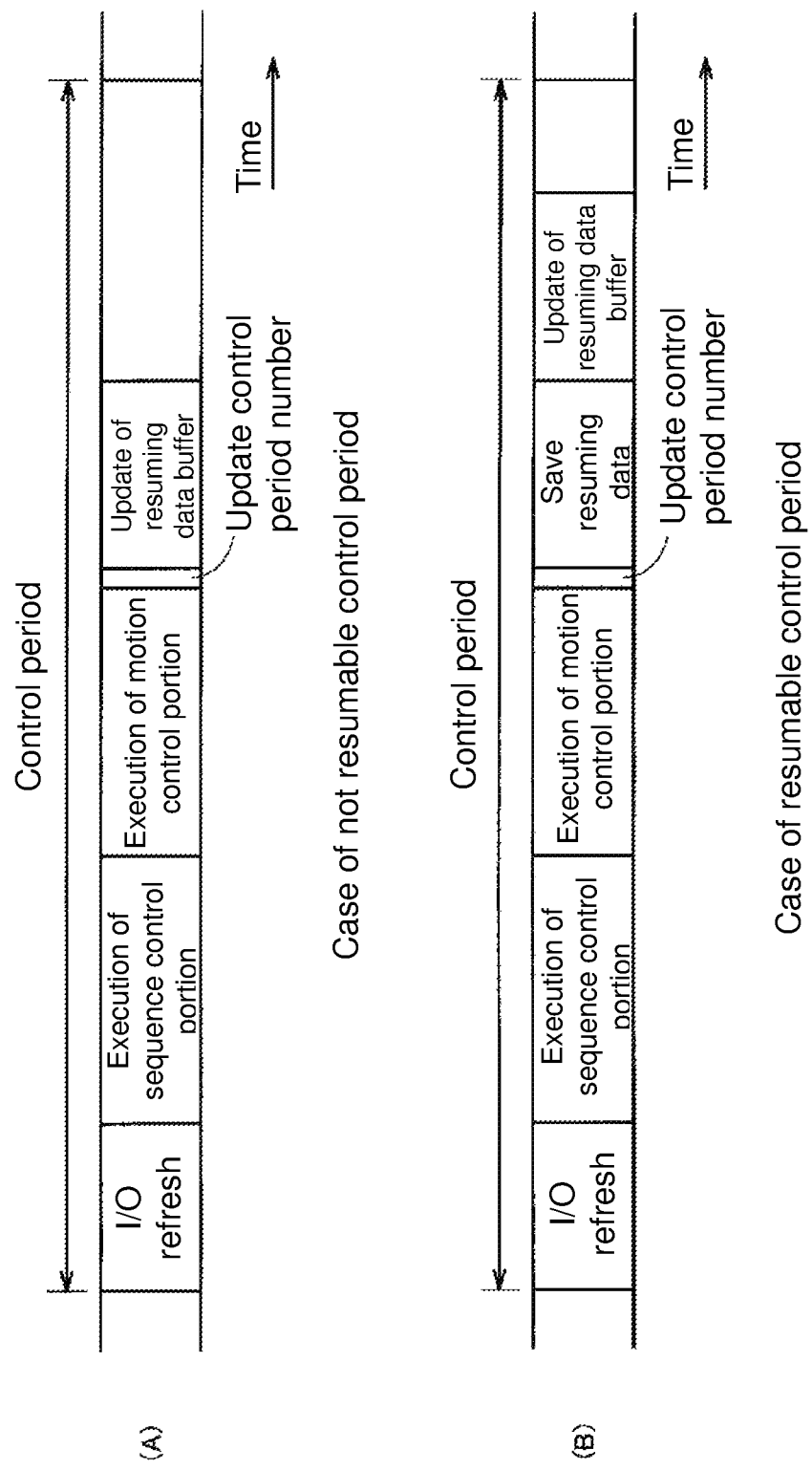
FIGS. 8A and 8b are views describing a case in which the processes in the control period are arrayed in time-series.

FIGS. 8A and 8b are views describing a case in which the processes in the control period are arrayed in time-series.

With reference to FIG. 8A, if not the resumable control period, each process of the I/O refresh process, the execution of the sequence control portion, the execution of the motion control portion, and the update of the control period number are executed. Thereafter, the resuming data buffer is overwrite updated (update resuming data buffer) with the updated control period number and the execution result data generated in such control period.

With reference to FIG. 8B, if the resumable control period, each process of the I/O refresh process, the execution of the sequence control portion, the execution of the motion control portion, and the update of the control period number are executed. Thereafter, the control period number updated in the previous control period and the execution result data generated in the previous control period stored in the resuming data buffer 828 are saved in the resuming data storage section 826 (save resuming data). The resuming data buffer 828 is then overwrite updated (update resuming data buffer) with the control period number updated in the relevant control period and the execution result data generated in such control period.

The control period number updating process, the resuming data buffer updating process, and the resuming data saving process are processes specific to the simulation not executed in the controller 14, which is the actual machine.

The time occupied by each control period is constant in the controller 14, which is the actual machine, where the control period is set to a constant time by being started at timer interruption even in the simulation execution.

The time after the necessary processes in the control period are completed is an idling time. Accordingly, the accuracy of predicting the execution time in the controller 14, which is the actual machine, from the required time of the simulation execution is thus enhanced. If this is not necessary, the process of the next control period can be immediately started after the necessary processes in the control period are completed.

Figure 9:
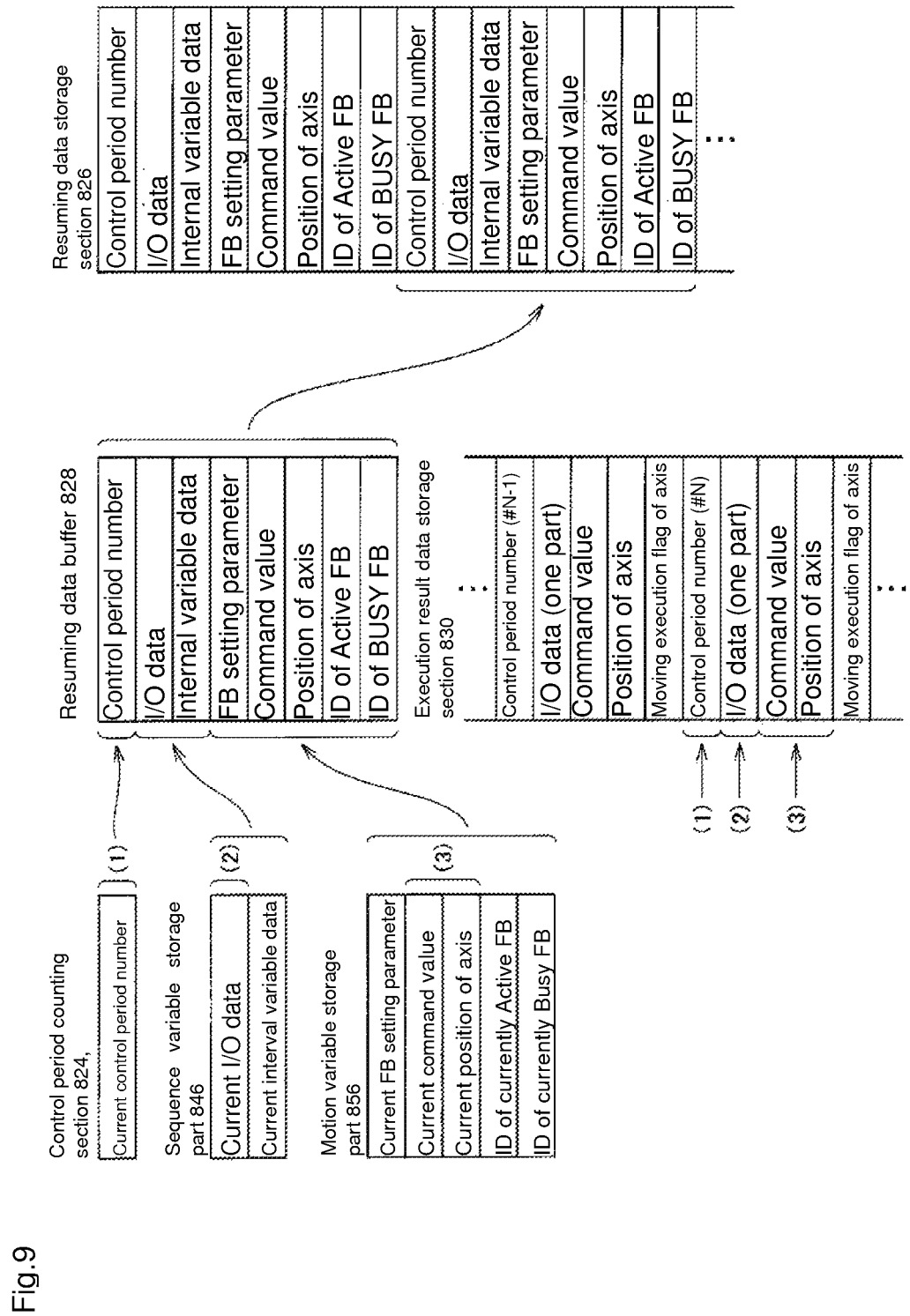
FIG. 9 is a view describing a flow of data in the simulation unit 806 related to the control period in which the command value is calculated according to the embodiment of the present invention.

FIG. 9 is a view describing a flow of data in the simulation unit 806 related to the control period in which the command value is calculated according to the embodiment of the present invention.

With reference to FIG. 9, the control period counting section 824 counts the current "control period number". The "control period number" is the total number of executions of the control period from the start of execution of the control program.

Here, "current" refers to the data in the control period in execution. This is the same in the following description. This is premised on the fact that it is data that may change for every control period.

The sequence variable storage part 846 stores the sequence variable. The "sequence variable" is data associated with the execution of the sequence control portion of the control program. This includes both the data read for the execution of the sequence control portion and the data to be written as a result of the execution. Specifically, the current "I/O data" and the "internal variable data" are stored.

The "I/O data" is the variable data associated with the execution of the sequence control portion, and is the data to be the target of the I/O refresh process. In other words, it is the input variable data and the output variable data.

The "internal variable data" is the variable data associated with the execution of the sequence control portion, but is the data limited to the use inside the program and not to be the target of the I/O refresh process.

The motion variable storage part 856 stores the motion variable. The "motion variable" is the data associated with the execution of the motion control portion of the control program. The motion variable includes both the data read to execute the motion control portion and the data written as a result of the execution. Specifically, current "FB setting parameter", "command value", "position of axis", "ID of Active FB" and "ID of Busy FB" are stored as the motion variable.

In the present embodiment, the motion control portion is assumed to be described as the motion function block (FB). The "FB setting parameter" is the parameter that specifies the manner of operation of the FB. The FB setting parameter may be a constant value given at the programming stage and a variable value in which the value is determined by the execution of the program. The FB setting parameter may include a secondary parameter calculated in the FB using the input value of the FB. For instance, the acceleration time is calculated from the velocity and the acceleration, which are the input values of the FB, and referenced in a plurality of control periods in acceleration, where the same calculation does not need to be performed for every control period by calculating the acceleration time in the control period in which the execution of the FB is started and storing the same in the motion variable storage part.

If the FB setting parameter is configured only by the constant, which is the input value of the FB, and the sequence variable, and the motion calculation executing part 854 is configured to be able to access the sequence variable storage part 846, the FB setting parameter is determined by the constant given by the program itself and the sequence variable stored in the sequence variable storage part 846, and hence the storing of the FB setting parameter to the motion variable storage part 856 is not essential.

The "command value" is the data which the motion control portion outputs for every control period. In the present embodiment, the command value includes at least the command value of the position. In addition, the command value may be the command value of the velocity, the command value of the torque, and the like.

The "position of axis" is a rotation position of the motor 18 or a position of a specific portion of the control target device driven by the motor 18. The actual position of the axis of the control target device is measured with a rotary encoder, and the like. In simulation, a virtual axis is prepared in the motion variable storage part 856, the command value is written in a storage region of the virtual axis to have such storage content as the position of the axis, and such value is updated with a new command value. In a period where the motion control portion outputs the command value for every control period for a certain axis, the position of the axis is the command value of the position calculated in the control period one before. In the period in which the motion control portion does not output the command value for every control period, the position of the axis is not updated and the same value is held.

The command value is not adopted as is for the position of the axis, and the predicted position calculated in view of the physical properties such as moment, mass, friction and the like of the movable portion of the control target device from the history of the command value may be adopted.

"Active" is a state of the FB calculating the command value for every control period. It is also referred to as an active state.

"Busy" is a state where the FB is in execution. The FB in the Busy state may be Active or may not be Active. As will be described later, Busy is realized when the FB is given the input of Execute ON. Normally, the FB is Active if Busy, but the FB other than at the coupled head may be in a state of Busy but not Active if a plurality of FBs is coupled by Buffered mode or Blending mode, as will be described later.

The "ID of FB" is information that individually specifies the FB used in one control program. For instance, it is the name of the FB given in programming.

When the control period is started, the simulation control section 820 causes the sequence control simulation section 840 and the motion control simulation section 850 to execute simulation for one period. The control period counting section 824 increment updates the "current control period number". As described above, the simulation control section 820 then determines whether or not the resumable control period, and if determining as not the resumable control period, overwrites and saves the "current control period number" from the control period counting section 824, the "current I/O data" and the "current internal variable data" from the sequence variable storage part 846, and the "current FB setting parameter", the "current command value", the "current position of axis", the "ID of currently Active FB", and the "ID of currently Busy FB" from the motion variable storage part 856 in the resuming data buffer 828.

If the simulation control section 820 determines as the resumable control period, the content of the resuming data buffer 828 is first recorded in the resuming data storage section 826, and then the resuming data buffer 828 is overwritten similar to when determining as not the resumable control period.

The control period number to be saved in the resuming data storage section 826 is the control period number of the period one before the resumable control period in which the re-execution can be started in the present embodiment, but the control period number may not be transferred from the resuming data buffer 828 and the control period number itself of the resumable control period may be saved as the resuming data. In this case, when re-executing the simulation, the process of preparation to start the re-execution is carried out on the premise that the control period number contained in the resuming data indicates the control period after the control period in which the resuming data other than the control period number is generated. Furthermore, if there is an engagement to save the control period number added with a constant offset value as the resuming data and subtract the same offset value at the time of resuming, the control period number other than the above may be saved. In other words, the control period number that can be corresponded to the resumable control period is to be saved.

The resuming data used to start the re-execution from the resumable control period is read out from the resuming data buffer and recorded in the resuming data storage section 826. This is not the same as storing the resuming data generated in the resumable control period. In the case of FIGS. 8A and 8B, the resuming data generated in the control period one before the resumable control period is stored. If the resuming data buffer 828 is configured as a ring buffer for a plurality of periods, the resuming data generated in the control period a few periods before may be stored in the resuming data storage section 826. In this case, the re-execution can be started from the control period specified using the specification of the user by performing the preparatory execution for a few periods from the control period after the control period in which the resuming data is generated at the time of re-execution.

If the command value and the position of the axis are both stored in the resuming data storage section 826, the velocity can be obtained from the difference in the command value and the position of the axis if the position of the axis is the command value of the previous period.

The position of the axis updated in the period one before the control period in which the resuming data is generated, that is, the position of the axis reflecting the command value output in the period two periods before may be stored in place of the command value in the resuming data storage section 826. The velocity may be obtained from the difference of the two "positions of axis". If the position of the axis is calculated as the predicted position taking into consideration the physical properties of the control target device, the predicted velocity corresponding thereto can be obtained.

Instead of obtaining the velocity at the time of resuming from the values of the two positions as described above, the velocity value calculated in advance may be stored in the resuming data storage section 826.

The resuming data of all the control periods may be saved in the resuming data storage section 826. The re-execution of the simulation then can be started from any control period.

The resuming data of all the control periods may once be saved in the resuming data storage section 826, and then the resumable control period may be set by an arbitrary number, and the resuming data corresponding to the control period that is not the target of setting of the resumable control period may be deleted thereafter.

At the timing (step S32) of executing the simulation of the I/O refresh process of FIG. 7 in every control period, the simulation control section 820 records the "current control period number" from the control period counting section 824, the "current I/O data" from the sequence variable storage part 846, and the "current command value" and the "current position of axis" from the motion variable storage part 856, in the execution result data storage section 830, and also generates the "moving execution flag of axis" and records the same in the execution result data storage section 830, as shown in (1), (2), and (3) in FIG. 9. The "moving execution flag of axis" is a flag indicating that one of the FBs controlling the relevant axis is Active. The I/O data may store all types of I/O data, but the user may specify the I/O data scheduled to be graph displayed in the time chart and store only such I/O data to save the storage capacity. Only one of the command value or the position of the axis may be stored in the execution result data storage section. If both are stored, the difference between the command value and the predicted position can be checked when the position of the axis is the predicted position calculated in view of the physical properties of the control target device.

If the velocity is to be obtained from the execution result data stored in the execution result data storage section 830, the velocity can be obtained from the position of the axis of the previous period (control period number #N−1) and the position of the axis of the present period (control period number #N).

If the position of the axis is the command value of the previous period, the velocity can be obtained from the difference of the command value and the position of the axis in the same control period.

Therefore, the velocity value calculated in advance may be stored in the execution result data storage section 830 instead of obtaining the velocity from the values of two positions when displaying the execution result data.

If the axis to be controlled is in plurals, the command value, the position of the axis, and the moving execution flag of the axis are stored for every axis in each storage section to which they are stored.

The FB setting parameter and the ID of the FB are stored for every FB if the target FB is in plurals.

In FIG. 9, any control period may be the resumable control period regardless of which FB is Active, that is, whether the control period of the period in which one of the FB is calculating the command value, or the control period of the period in which only the sequence control portion is being executed.

Figure 10:
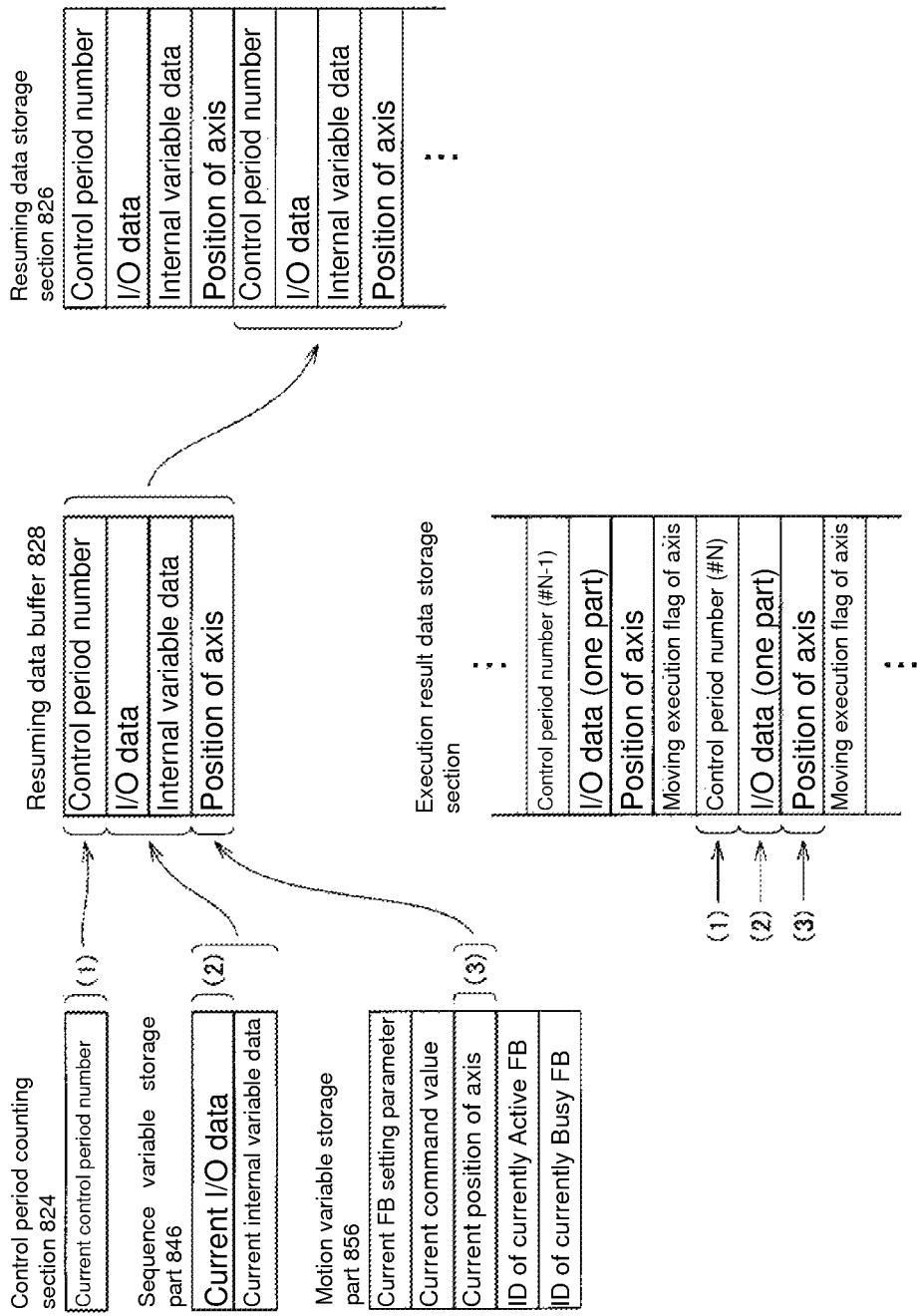
FIG. 10 is a view describing a flow of data in the simulation unit 806 related to the control period in which the command value is not calculated according to the embodiment of the present invention.

FIG. 10 is a view describing a flow of data in the simulation unit 806 related to the control period in which the command value is not calculated according to the embodiment of the present invention.

With reference to FIG. 10, the flow of data in a period in which none of the FBs is Active is shown. During this period, the data related to the state of the FB (FB setting parameter, command value, ID of the Active FB, ID of the Busy FB) does not effectively exist, and hence the data related to the state of the FB is not stored as the resuming data and the execution result data. The position of the axis effectively exists even in the period in which the FB is not Active, and thus is stored.

In this example, the region of the non-storing data is displayed in a packed mode, but the data region itself may be remained ensured.

If the period in which the resumable control period can be set is limited to the period in which none of the FB is Active, the data related to the state of the FB does not need to be saved as the resuming data, and thus the storage capacity for saving the resuming data can be reduced. Even when the first control period in which one of the FB becomes Active from the period in which none of the FB is Active becomes the resumable control period, this is similar to the case in which the period in which the resumable control period can be set is limited to the period in which none of the FB is Active since none of the FB is still Active in the period before the data to be saved is generated.

If not resuming from the middle of the FB but always resuming from the head of the FB, a method of limiting the control period that can be the resumable control period is also useful.

Figure 11:
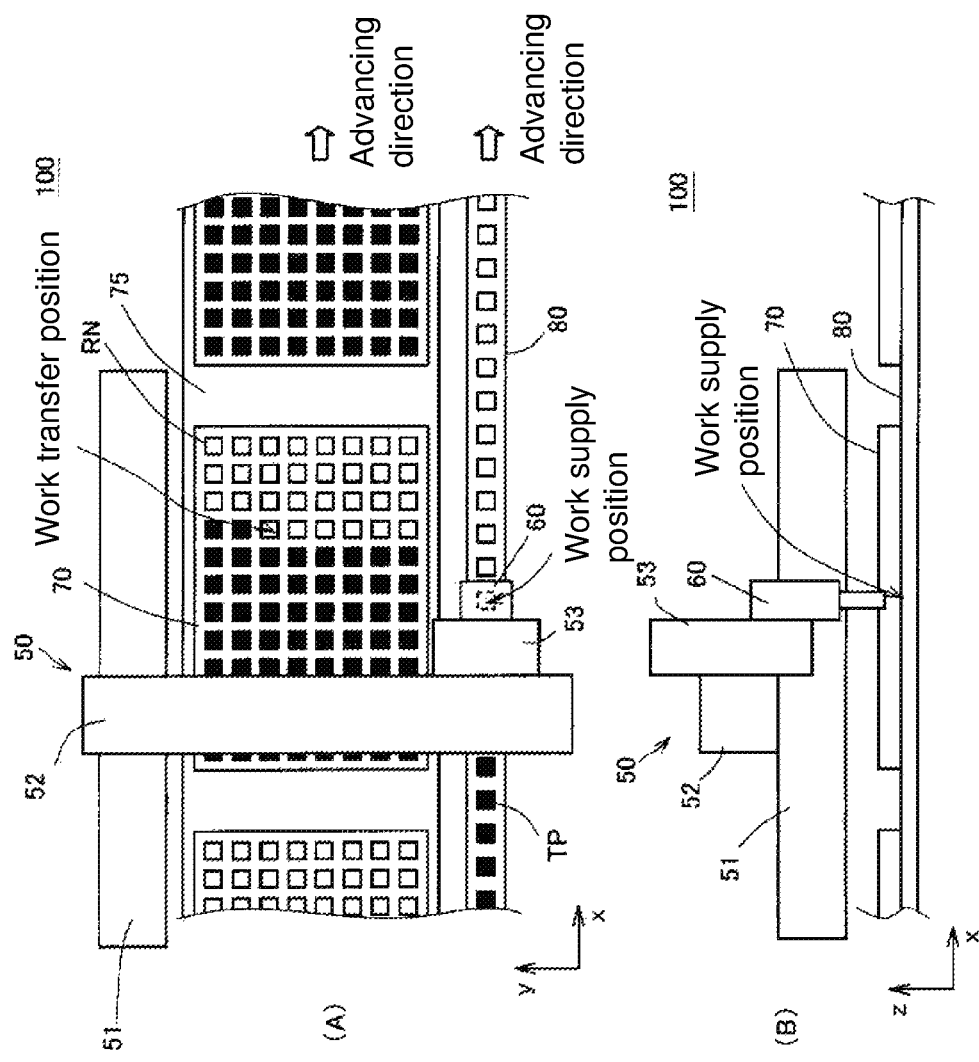
FIGS. 11A and 11B are views describing an IC chip transfer device 100 according to the embodiment of the present invention.

FIGS. 11A and 11B are views describing an IC chip transfer device 100 according to the embodiment of the present invention. In the embodiment of the present invention, the IC chip transfer device 100 is described as the control target device by way of example.

FIG. 11A shows a plan view of the IC chip transfer device 100.

FIG. 11B shows a front view of the IC chip transfer device 100.

With reference to FIGS. 11A and 11B, the IC chip transfer device 100 is configured by an XYZ guide 50 including an X guide 51 enabling positioning of the X axis by a motor (not shown), a Y guide 52 enabling positioning of a Y axis, and a Z guide 53 enabling positioning of a Z axis, and a vacuum adsorption chuck 60 for vacuum adsorbing an IC chip TP using the XYZ guide 50. The vacuum adsorption chuck 60 vacuum adsorbs the IC chip TP arranged at a predetermined interval on an IC chip conveyor 80. The IC chip TP is mounted at a predetermined position of an IC tray 70 mounted on an IC tray conveyor 75 using the XYZ guide 50.

The IC tray 70 includes empty cells RN for mounting the IC chips in a matrix form. The XYZ guide 50 transfers the IC chip one at a time to the empty cell RN arranged in the IC tray 70. Specifically, a work supply position, to which the IC chip TP is supplied, is set in advance, and one of the empty cells RN of the IC tray 70 is specified as a work transfer position. The XYZ guide 50 transfers the vacuum adsorbed IC chip TP using the vacuum adsorption chuck 60 from the work supply position to the work transfer position, and mounts the IC chip TP at the specified work transfer position.

The IC chip TP mounted on the IC chip conveyor 80 is moved to the work supply position by moving the IC chip conveyor 80. The IC chip TP is arranged at a predetermined interval along an advancing direction of the IC chip conveyor 80.

Figure 12:
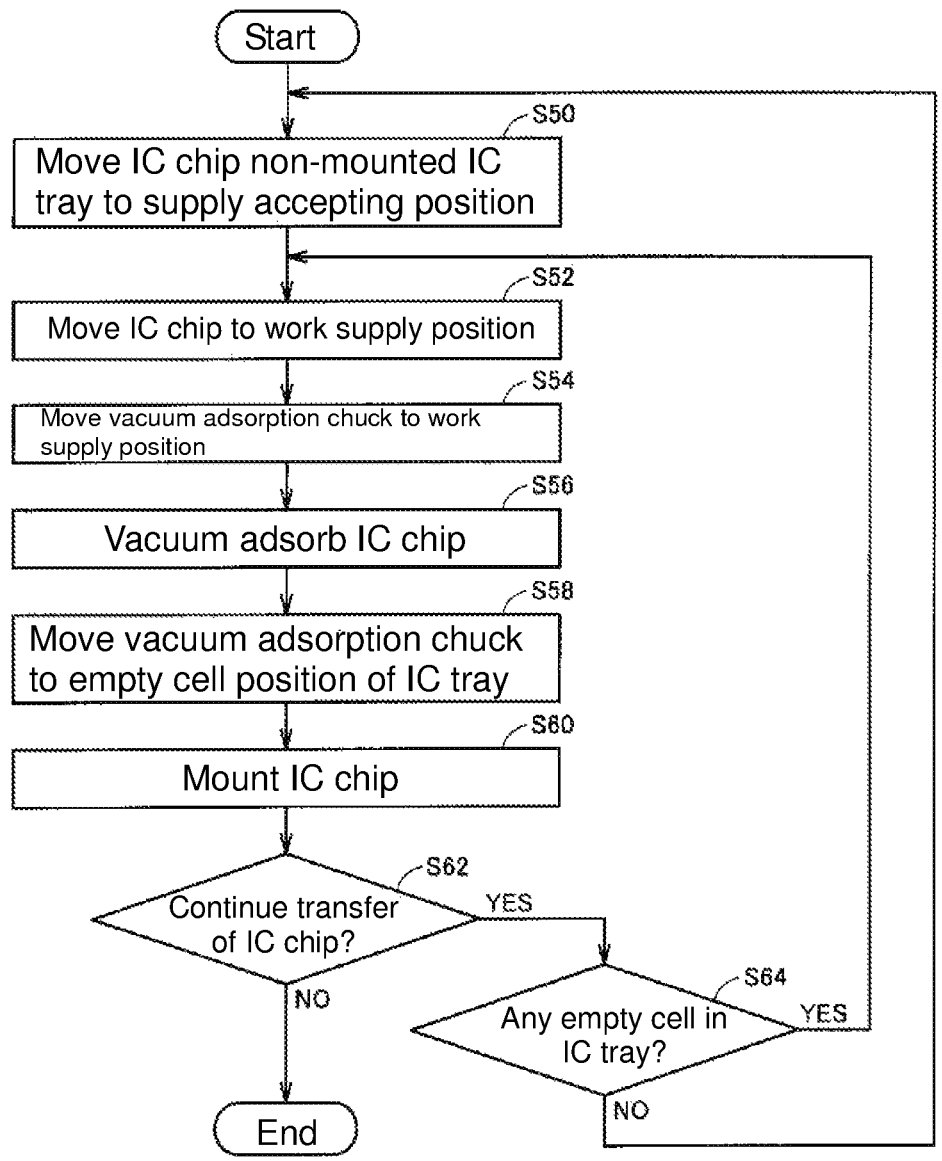
FIG. 12 is a view describing a flow of operation of the IC chip transfer device 100 according to the embodiment of the present invention.

FIG. 12 is a view describing a flow of operation of the IC chip transfer device 100 according to the embodiment of the present invention.

With reference to FIG. 12, the IC tray 70, on which the IC chip TP is not mounted, that is, the non-mounted IC tray 70 is first moved to the supply accepting position using the IC tray conveyor 75 (step S50).

The IC chip conveyor 80 is then moved to move the IC chip TP to the work supply position (step S52).

The vacuum adsorption chuck 60 is then moved to the work supply position using the XYZ guide 50 (step S54).

The IC chip TP is then vacuum adsorbed using the vacuum adsorption chuck 60 (step S56).

The IC chip TP vacuum adsorbed using the XYZ guide 50 is moved to the empty cell position (work transfer position) of the IC tray 70 (step S58).

The IC chip TP is mounted on the empty cell position (work transfer position) of the IC tray 70 (step S60).

Whether or not to continue the transfer of the IC chip TP is then determined (step S62).

If determined not to continue the transfer of the IC chip TP in step S62 (NO in step S62), the process is terminated.

If determined to continue the transfer of the IC chip in step S62 (YES in step S62), whether or not the IC tray 70 has an empty cell RN is then determined (step S64). If determined that the IC tray 70 has an empty cell RN (YES in step S64), the IC chip TP is moved to the supply position (step S52). The subsequent processes are the same, and thus the detailed description thereof will not be repeated. In other words, the IC chip TP is mounted on the empty cell RN of the IC tray 70 one at a time.

If determined that the IC tray 70 does not have the empty cell in step S64 (NO in step S64), the non-mounted IC tray 70 is moved to the supply accepting position (step S50).

The above processes are then repeated.

Figure 13:
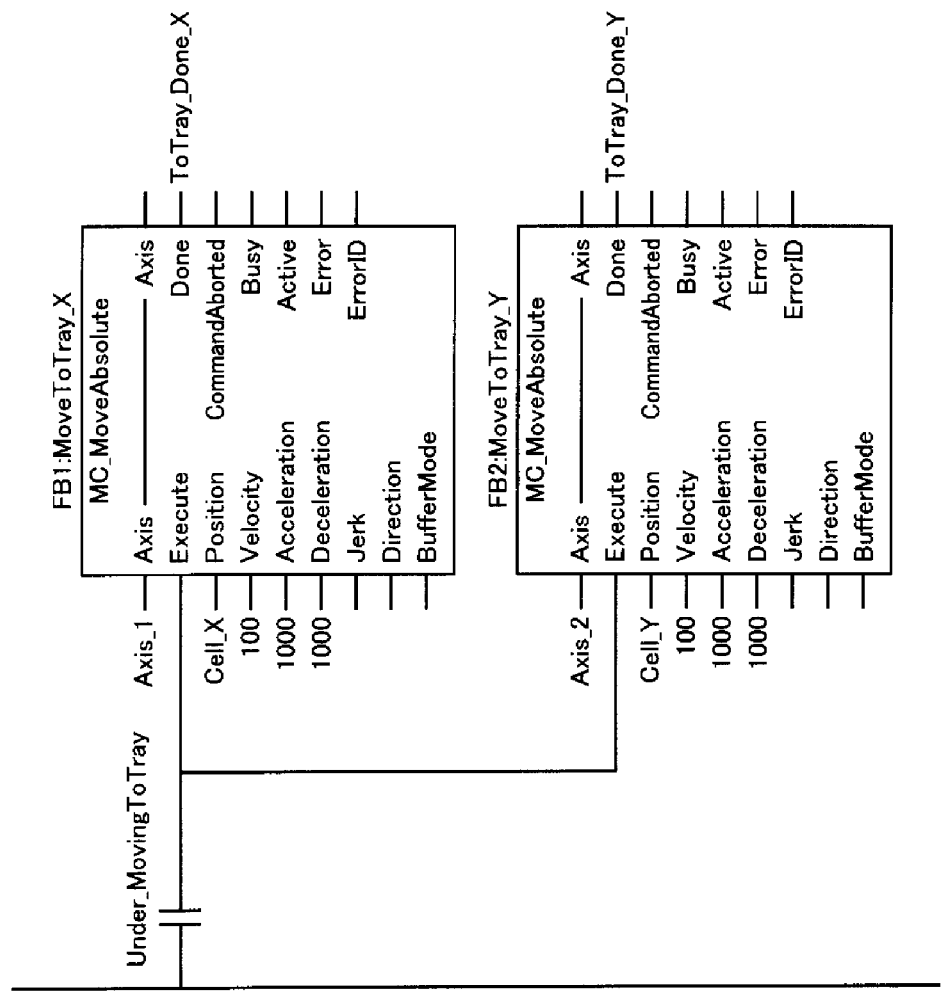
FIG. 13 is a view describing one part of the control program controlling the XYZ guide 50 in the IC chip transfer device 100.

FIG. 13 is a view describing one part of the control program controlling the XYZ guide 50 in the IC chip transfer device 100.

With reference to FIG. 13, a program of the portion to control the XYZ guide 50 to move the vacuum adsorption chuck 60 to the position of the empty cell RN of the IC tray 70 is shown herein.

The FB1 and the FB2 are the motion function blocks of the same type having the name MC_MoveAbsolute, and having the function of generating the command value for every control period to move one axis (rotation position of the motor) from the current position to the target position given with an absolute coordinate.

The FB1 (MoveToTray_X) is used to move the X coordinate position of the vacuum adsorption chuck 60 to the X coordinate position of the empty cell.

The FB2 (MoveToTray_Y) is used to move the Y coordinate position of the vacuum adsorption chuck 60 to the Y coordinate position of the empty cell. The FB1 and the FB2 correspond to the motion control portion of the control program, herein.

The terminal on the left side of each FB is an input terminal, and the terminal on the right side is an output terminal.

The input terminal will be described first.

"Axis" terminal is given the axis name corresponded to the relevant FB. X axis is assigned to Axis_1, and Y axis is assigned to Axis_2.

When ON input is provided to the "Execute" terminal, the FB is started entering the Busy state and the Active state.

Each terminal of "Position", "Velocity", "Acceleration", "Deceleration", and "Jerk" is provided with a value of target position, velocity, acceleration, deceleration, and jerk, respectively.

The target position is provided to the "Position" terminal under a variable name Cell_X, Cell_Y. The X coordinate and the Y coordinate of the empty cell calculated in a different area of the program are stored in the Cell_X, Cell_Y.

Each terminal of "Velocity", "Acceleration", and "Deceleration", is given a constant value at the programming stage. The input to the "Jerk" terminal is omitted.

"Direction" is a terminal for a ring mode in which distinction is not made even if the axis makes a few rounds and arrives at the position as long as the rotation position of the axis in one round is the same, and the description thereof will not be made herein.

"BufferMode" will be described later. The BufferMode is not used here.

The output terminal will now be described.

"Axis" terminal of the output outputs the data of the Axis terminal of the input as is.

"Done" terminal outputs ON in the control period after the control period in which the execution of the FB is completed.

"CommandAborted" terminal outputs ON in the control period after the control period in which the execution of the FB is aborted.

"Busy" terminal outputs ON while the FB is in the Busy state.

"Active" terminal outputs ON while the FB is in the Active state.

"Error" terminal outputs ON when some kind of error occurs.

"ErrorID" terminal outputs an error code when an error occurs.

When a contact (variable) named Under_MovingToTray is turned ON, ON is provided to the "Execute" terminal of the FB1 and the FB2, and the FB1 and FB2 start the calculation of the command value to move the X axis and the Y axis towards the position of the empty cell RN. After the movement of the each axis is completed, each "Done" terminal outputs ON. The value of ON or OFF of the output of the "Done" terminal is stored in the contact (variable) named ToTray_Done_X, ToTray_Done_Y. Such contacts are used to start the lowering operation of the Z axis for mounting the IC chip TP in the empty cell.

Figure 14:
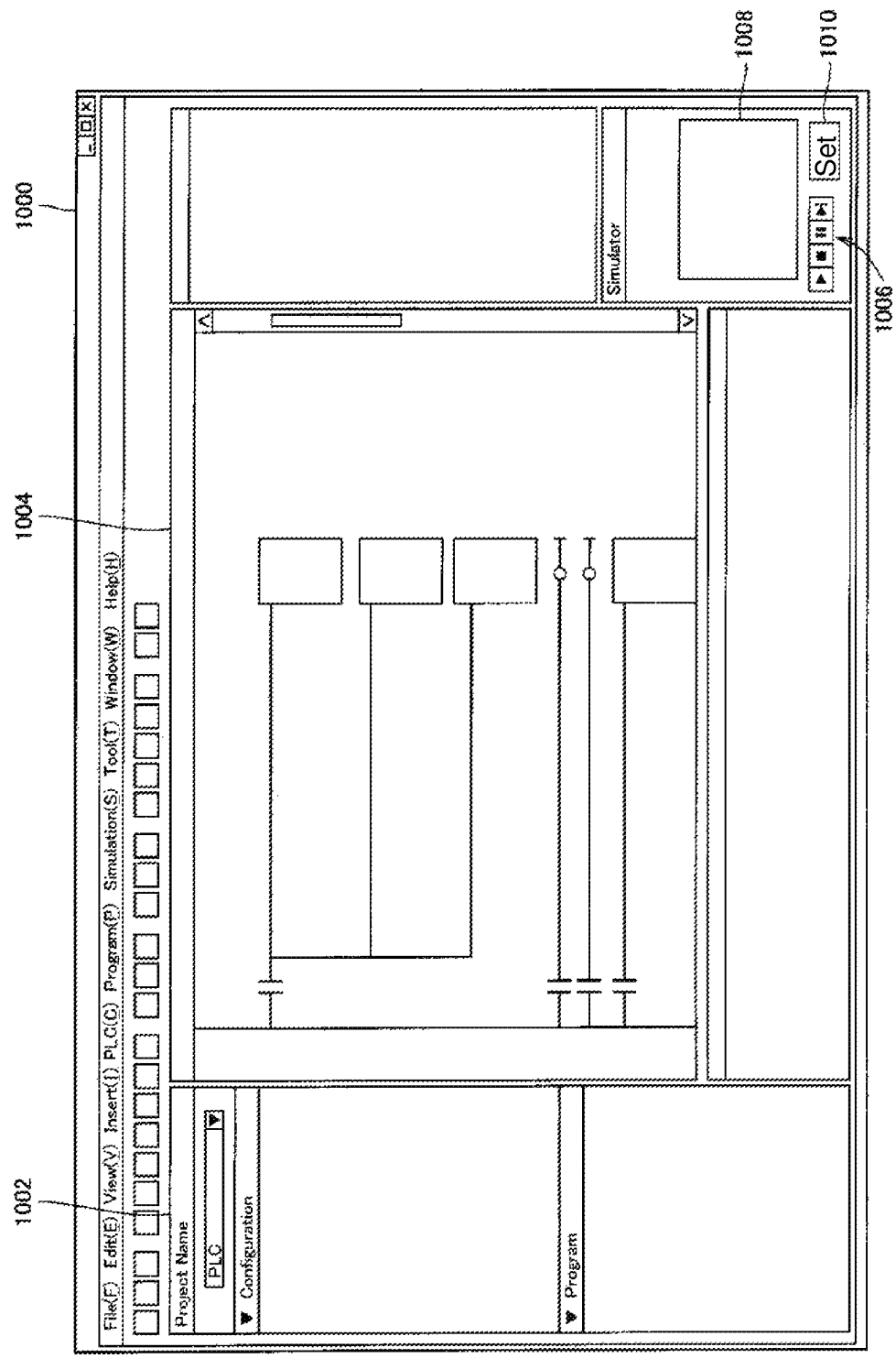
FIG. 14 is a view describing a window screen of the controller support program according to the embodiment of the present invention.

FIG. 14 is a view describing a window screen of the controller support program according to the embodiment of the present invention.

With reference to FIG. 14, a window screen 1000 of the controller support program according to the embodiment of the present invention includes a setting column 1002 and a control program editing column 1004.

The setting column 1002 is a portion for carrying out various setting inputs necessary in performing edit and simulation of the control program.

The control program editing column 1004 is used to input and edit the control program.

In a lower right region, a case where a set button 1010 of a resumable point setting method, a simulation execution control button 1006, and a simulation execution result display link portion 1008 are provided is shown.

Figure 15:
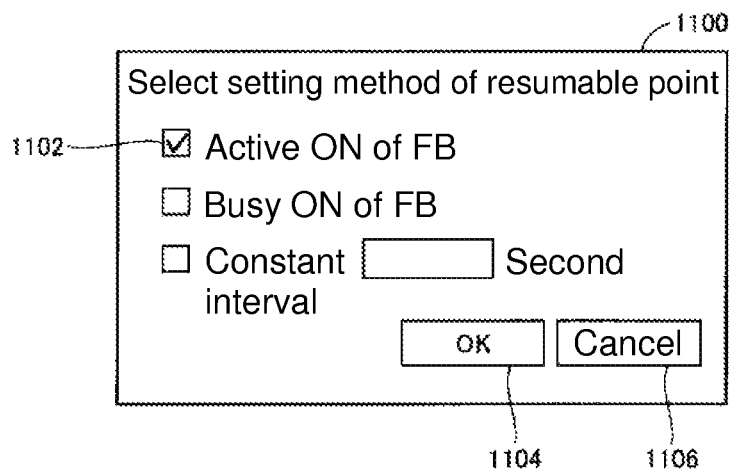
FIG. 15 is a view describing a selection window screen 1100 of a resumable point setting method according to the embodiment of the present invention.

When the set button 1010 of the resumable point setting method is pushed, a selection window screen 1100 of FIG. 15 is opened as a different window. The resuming data is saved when simulation is executed after making such setting.

Four buttons are provided for the simulation execution control button 1006, where buttons for instructing start, stop, pause, and step execution of the simulation are provided from the left.

Figure 16:
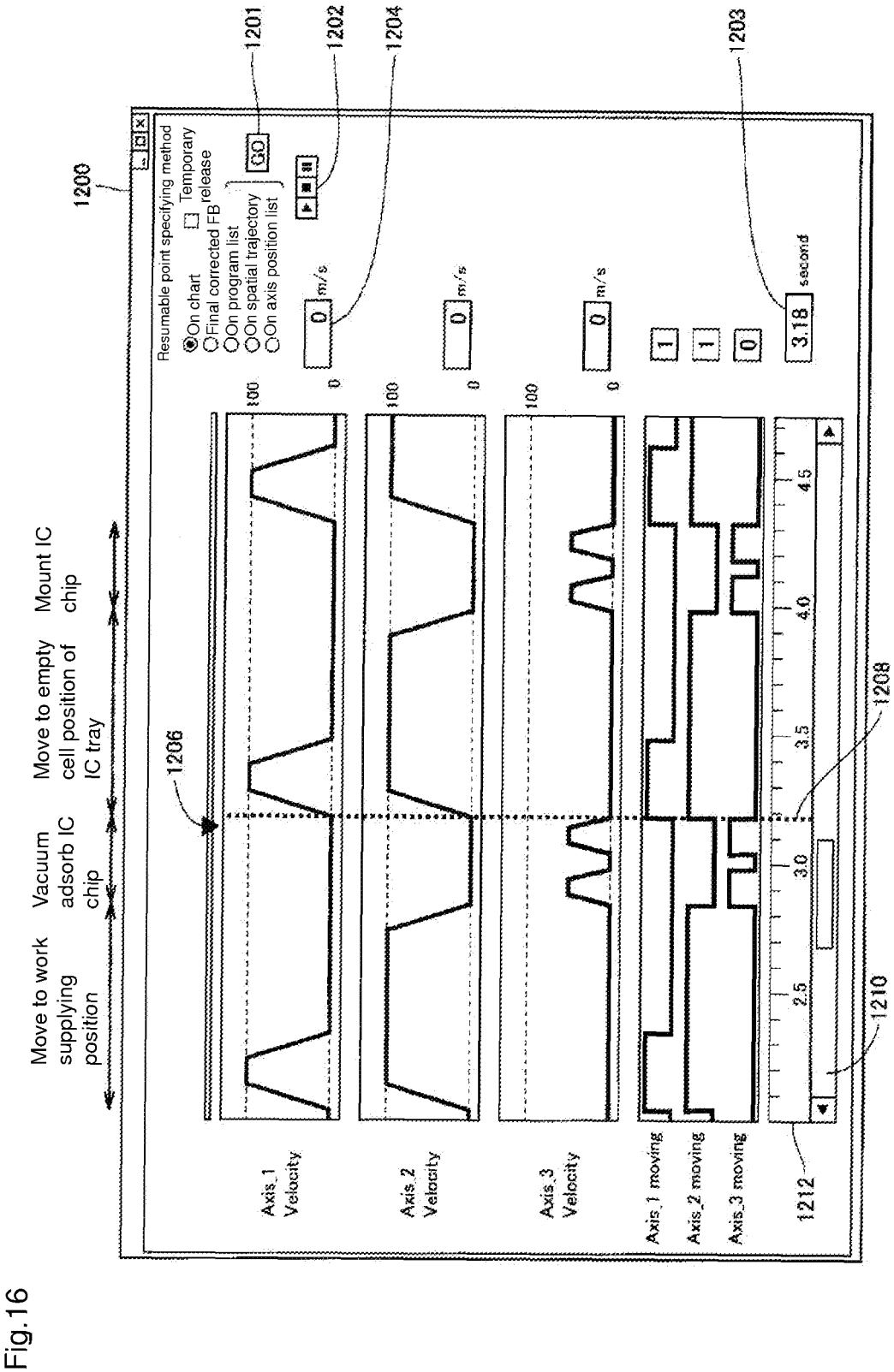
FIG. 16 is a view describing a time chart window screen 1200 according to the embodiment of the present invention.

The simulation execution result display link portion 1008 opens a time chart window screen of FIG. 16 as a different window when the link portion is clicked (pushed).

FIG. 15 is a view describing the selection window screen 1100 of the resumable point setting method according to the embodiment of the present invention.

With reference to FIG. 15, the selection window screen 1100 according to the embodiment of the present invention includes a checkbox 1102 where each of "Active ON of FB", "Busy ON of FB", and "constant interval" can be put a check, and a case where check is put on "Active ON of FB" through the mouse 906 or the like is shown in the present example. An "OK" button 1104 and a "cancel" button 1106 are arranged, where the setting method with a check in the checkbox becomes effective when the "OK" button 1104 is clicked (pushed). The window screen is closed when the "OK" button 1104 or the "cancel" button 1106 is clicked (pushed).

If check is put on the "Active ON of FB", the control period in which each FB becomes Active ON is assumed as the resumable control period.

The control period a certain number before the control period in which each FB becomes Active ON may become the resumable control period. The user can easily start the re-execution from around a time where the motion control portion becomes the active state by setting the resumable control period with the control period in which the motion control portion becomes the active state as a reference. The amount to save the resuming data can be reduced by not setting the resumable control period that is not associated with the control period in which the motion control portion becomes the active state or reducing the number of such settings, but convenience of a certain extent can be still maintained.

If check is put on the "Busy ON of FB", the control period in which each FB becomes Busy ON is assumed as the resumable control period. If the control period in which a certain FB becomes Busy ON is assumed as the resumable control period, in the period one before, that is, in the period in which the resuming data is generated, another FB that is Busy or Active with respect to the axis may possibly exist and hence "ID of currently Active FB" needs to be saved as the resuming data, but another FB that is Busy but not Active with respect to the axis does not exist and hence "ID of currently Busy FB" may not be saved as the resuming data. The control period a certain number before the control period in which each FB becomes Busy ON may be assumed as the resumable control period. The user can easily start the re-execution from around a time where the motion control portion becomes the executing state by setting the resumable control period with the control period in which the motion control portion becomes the executing state as a reference. The amount to save the resuming data can be reduced by not setting the resumable control period that is not associated with the control period in which the motion control portion becomes the executing state or reducing the number of such settings, but convenience of a certain extent can still be maintained.

If check is put on the "constant interval" and the time (second) is specified, the control period corresponding to a time for every specified time interval is assumed as the resumable control period. If the setting interval of the resumable control period is sufficiently small, re-execution can be started approximately from any place Not limited to one, a plurality of setting methods can be simultaneously made effective.

FIG. 16 is a view describing a time chart window screen 1200 according to the embodiment of the present invention.

With reference to FIG. 16, the time chart window screen 1200 according to the embodiment of the present invention is opened when the simulation execution result display link portion 1008 of FIG. 14 is clicked (pushed).

The state of velocity and the state of the moving execution flag of each axis is shown for the operation of one cycle of the adsorption and mounting of one IC chip TP.

In the column "resuming point specifying method", the resuming point specifying method can be alternatively selected from five methods.

Specifically, if "on chart" is selected in the "resuming point specifying method" column, the resuming point can be specified by dragging the time specifying tab in a horizontal direction. If the resumable point is set to the "Active ON of FB" or "Busy ON of FB", the rising timing of the moving execution flag of one of the axes is the resumable point. The resuming point is indicated by a position of a vertical cursor line 1208, which cursor line 1208 moves with the movement of the time specifying tab 1206 so that the time specifying tab 1206 can continuously change the position whereas the manner of movement of the cursor line 1208 is discrete since the resumable points exist in a discrete manner. In the present example, the cursor line 1208 is positioned at the resumable point of 3.18 seconds closest to the position of the time specifying tab 1206. If the time specifying tab is slightly moved to the left from such state, the cursor line 1208 is discretely moved to the position of 3.04 seconds where the moving execution flag of the Z axis rises. In a time display column 1203, a time at the position of the cursor line 1208 is displayed on a time scale 1212, where a value of the vertical axis of each graph at the position of the cursor line 1208 is displayed in a value display column 1204. The position of the time scale 1212 can be changed by operating a scroll bar 1210.

Therefore, the user can instruct the start of re-execution in correspondence with the transition of the execution result of the control program by accepting the instruction of the user on the position on the graph displayed on the monitor 907, specifying the resumable control period corresponding to the position on the graph instructed by the user, and starting the re-execution of the simulation from the resumable control period.

If "temporary release" on the right side of "on chart" is given a check in the "resuming point specifying method" column, the state of the specifying operation of the resuming point is temporarily released, the cursor line 1208 is displayed at the same position as the time specifying tab 1206 and continuously moved, and the value of each graph at an arbitrary time can be examined by the display of the value display column 1204.

If "final corrected FB" is selected in the "resuming point specifying method" column, the resumable control period in which re-execution can be carried out from the FB where the input value is most recently corrected in the control program editing column 1004 of FIG. 14 is specified as the resuming point. In this case, by the simulation unit 806, the information specifying the corrected FB is acquired from the control program editing unit 810, the resumable control period in which the re-execution can be carried out from the most recently corrected FB is specified, and the re-execution of the simulation is started from the resumable control period. Accordingly, the re-execution can be easily carried out from the corrected motion control portion.

If "on program list" is selected in the "resuming point specifying method" column, the FB is selected in the program list displayed in the control program editing column 1004 of FIG. 14, and the resumable control period in which re-execution can be carried out from such FB is specified as the resuming point. Specifically, one FB is selected by clicking in the program list, and "specify as resuming point" is selected from a pull-down menu. In this case, the simulation unit 806 specifies the resumable control period in which the re-execution can be carried out from the FB specified on the display of the program list, and starts the re-execution of the simulation from the resumable control period. Accordingly, the user can instruct the start of re-execution in correspondence with the motion control portion shown in the list display of the control program.

Figure 17:
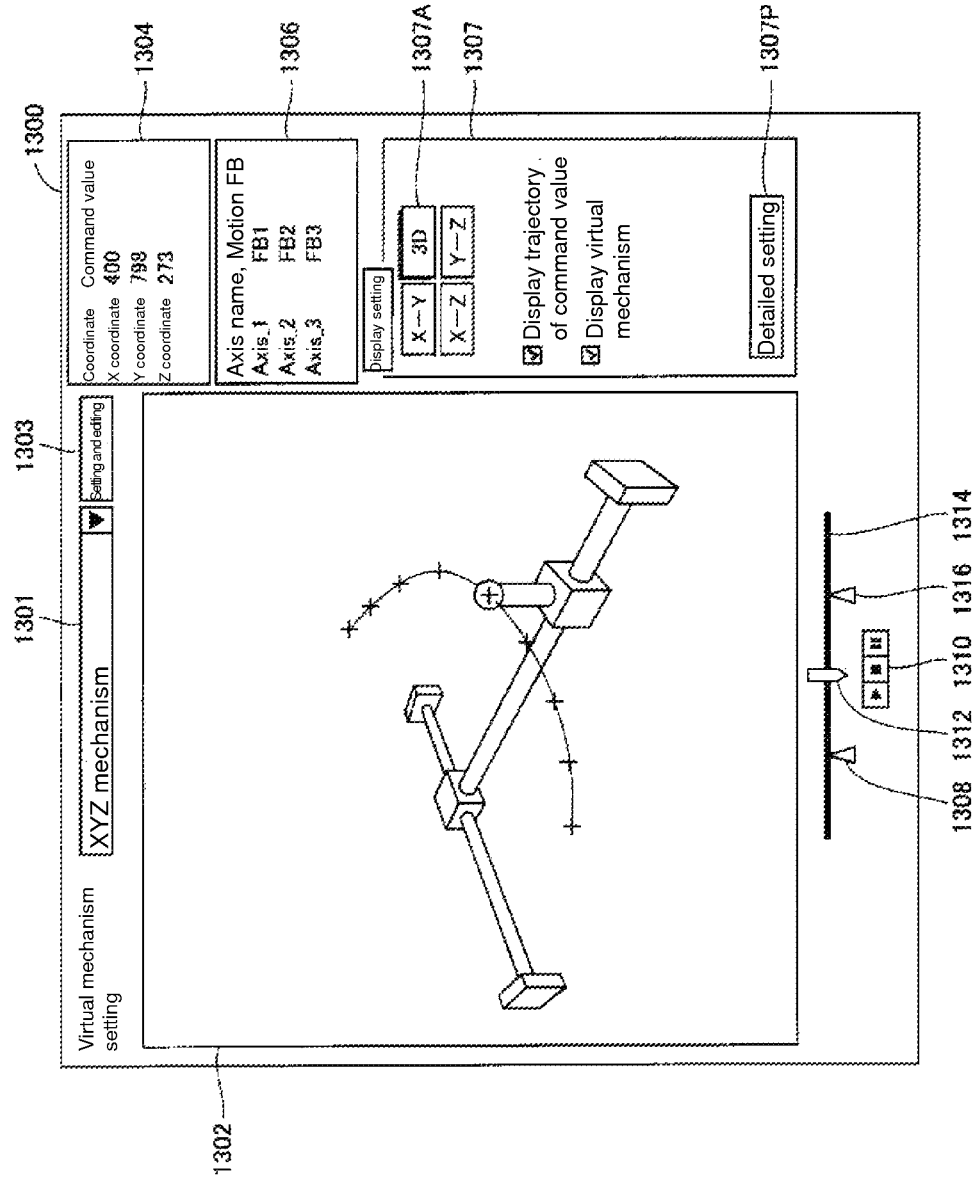
FIG. 17 is a view describing a spatial trajectory display window screen 1300 according to the embodiment of the present invention.

If "on spatial trajectory" is selected in the "resuming point specifying method" column, the control period corresponding to the position specified on the spatial trajectory displayed in a spatial trajectory display window screen 1300 of FIG. 17 is specified as the resuming point.

Figure 18:
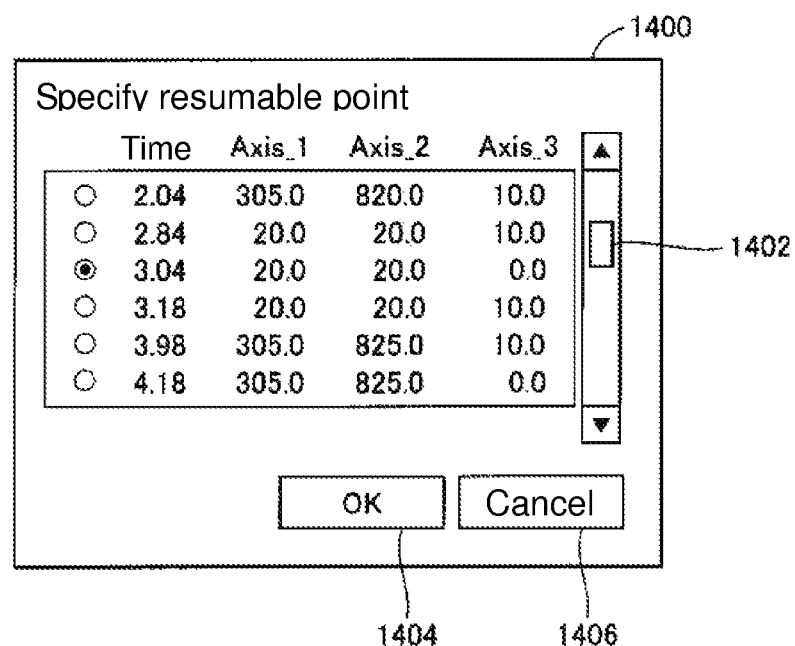
FIG. 18 is a view describing a display window screen 1400 of a list of axis positions according to the embodiment of the present invention.

If "on axis position list" is selected in the "resuming point specifying method" column, the resuming point is specified according to the specification on the axis position list of FIG. 18.

In all cases of "final corrected FB", "on program list", "on spatial trajectory", and "on axis position list", the graph is automatically scrolled so that the specified resuming point is displayed.

When one of the "on program list", "on spatial trajectory", or "on axis position list" is selected and "GO" button 1201 is pushed, the corresponding window screen of FIG. 14, FIG. 17, or FIG. 18 is opened or the window screen on the near side is displayed.

FIG. 17 is a view describing the spatial trajectory display window screen 1300 according to the embodiment of the present invention.

With reference to FIG. 17, the spatial trajectory displayed on the spatial trajectory display window screen 1300 is drawn using positions of series of axes stored in the execution result data storage section.

It may be drawn using the stored command value instead of the position of the axis.

The spatial trajectory displayed in FIG. 17 shows an example of a trajectory drawing a semicircle for the projection onto the XY coordinate plane while rising in the Z direction, as opposed to the case of the XYZ guide 50 of the IC chip transfer device 100.

The name of the virtual mechanism currently being used is displayed in a virtual mechanism setting column 1301 at the upper part of the screen. The virtual mechanism is an electronically built model, and is a three-dimensional model that moves by a series of command values whose configuration is abstracted for each type of mechanism such as the XYZ guide. A list of virtual mechanisms appears when a triangular mark at the right of the column is clicked, and change can be made from the currently used virtual mechanism to another virtual mechanism.

When a button 1303 for setting and editing is pushed, a virtual mechanism setting screen is opened as a different window screen.

The current position of the axis for every coordinate axis is displayed in a coordinate value display column 1304.

The corresponding relationship of the axis name used in the control program and the currently operating FB name is displayed in a correspondence display column 1306 of the axis and the motion FB.

In the present example, a "3D" button 1307A of a display setting column 1307 is pushed, so that the 3D display is greatly displayed in an image display column 1302. When the "3D" button 1307A is pushed again, a 4-division display including, in addition to the 3D display, a projection view to the XY plane, a projection view to the XZ plane, and a projection view to the YZ plane is realized. When one button other than "3D" is pushed, the corresponding planar projection view is displayed in an enlarged manner.

The 3D display is described by a perspective drawing method, where the position of the view point and the vision line direction in the three-dimensional space can be freely changed with the mouse operation.

A small sphere is displayed as a current position marker indicating the current position at the distal end of a linear moving element in the Z direction.

In the display setting column 1307, the selection on whether or not to display the trajectory of the command value, and the selection on whether or not to display the virtual mechanism can be made. If the virtual mechanism is not to be displayed, only the curve of the trajectory is displayed. When a detailed setting button 1307P is pushed, the setting of the thickness of the trajectory, the setting of the display color of the trajectory, the setting of displaying the coordinate axis and the coordinate numerical value, and the like can be carried out.

A moving image reproduction control button 1310 is displayed at the lower part of the screen.

A reproduction time bar 1314 represents the time required to execute the control program from beginning to end. A current time tab 1312 is moved from left to right on the reproduction time bar 1314 according to elapse of the execution time of the control program. The display start time of the moving image can be adjusted by drag operating the current time tab 1312 with the mouse 906. A trajectory starting point tab 1308 and a trajectory ending point tab 1316 indicate the display start time and end time of the trajectory, both of which can be moved along the reproduction time bar 1314 by being drag operated with the mouse 906. When the current position is continuously moved with elapse of time, the length of the trajectory being displayed is changed when the trajectory starting point tab 1308 and the trajectory ending point tab 1316 are moved in accordance therewith.

When the display of the moving image is started, a state in which each mechanism element moves and the current position marker moves along the trajectory is displayed.

Each sequentially displayed still image configuring the moving image may not be created for all the control periods and may be created for the control period for every constant interval.

In the image display column 1302, a great number of cross marks displayed overlapping the trajectory indicate the position where the resumable point of the simulation is set. In this example, the resumable point is set at a temporally constant interval. The user can specify the simulation resuming point by clicking and selecting one of such marks, and selecting "specify as resuming point" from the pull-down menu. In this case, the simulation unit specifies the resumable control period corresponding to the position on the trajectory instructed by the user, and starts the re-execution of the simulation from the relevant resumable control period. Accordingly, the user can instruct the start of re-execution in correspondence with the spatial trajectory of the command value of the position.

FIG. 18 is a view describing a display window screen 1400 of a list of axis positions according to the embodiment of the present invention.

With reference to FIG. 18, the display window screen 1400 according to the embodiment of the present invention displays the time corresponding to the control period in which the resumable point is set and the list of axis positions, so that the resuming point can be specified therefrom.

The content displayed in the display window screen can be scrolled by operating the scroll bar 1402. The resuming point that can be specified is only one. In the present example, the position of each axis is displayed with a numerical value but may be displayed with a variable name representing the axis position. The specification of the resuming point becomes effective by clicking (pushing) an "OK" button 1404. The specification of the resuming point can be canceled by clicking (pushing) a "cancel" button 1406.

In this case, the simulation unit 806 specifies the resumable control period corresponding to the position of the list of positions instructed by the user, and starts the re-execution of the simulation from the resumable control period. Accordingly, the user can instruct the start of the re-execution in correspondence with the transition of the execution result of the control program.

Figure 19:
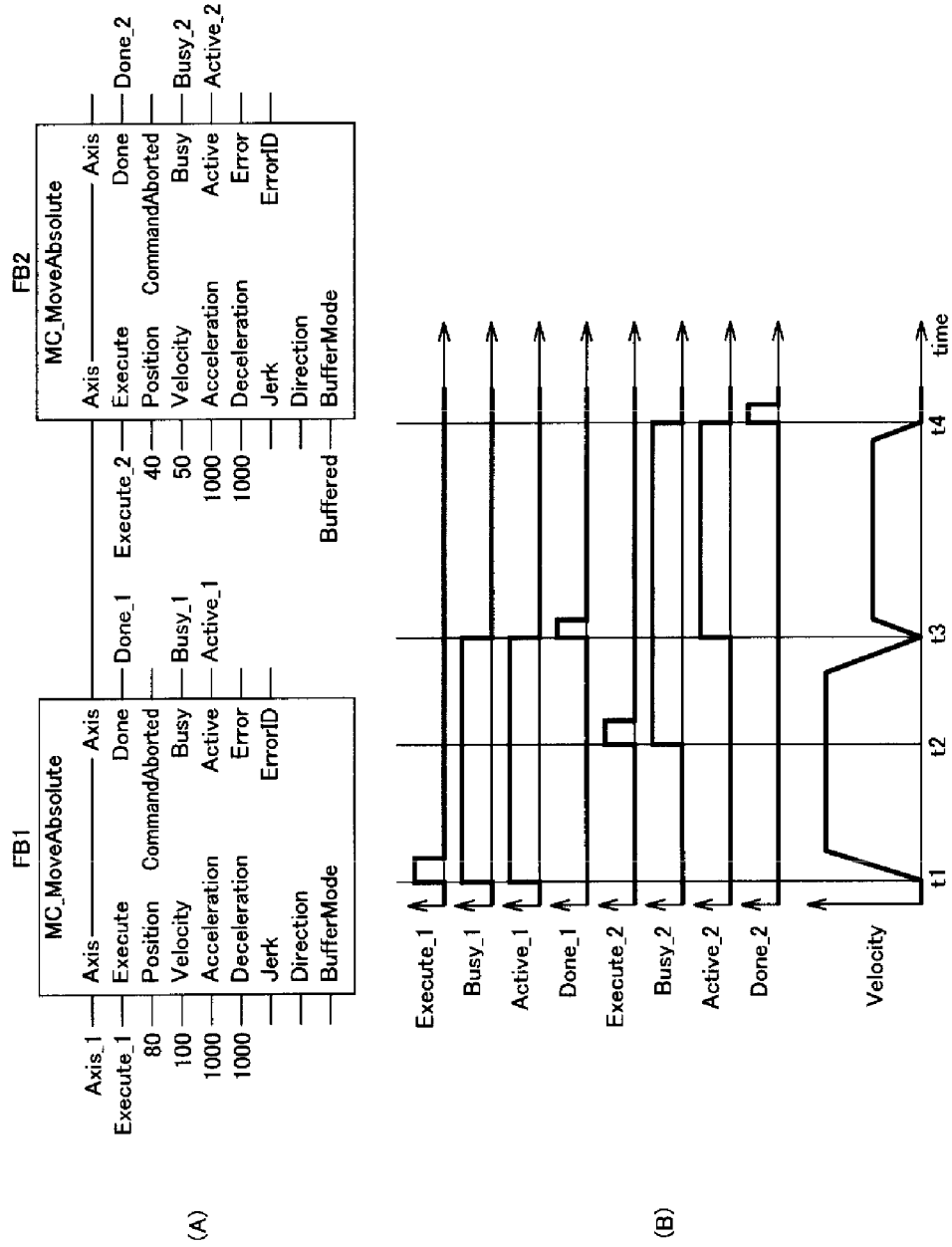
FIGS. 19A and 19B are views describing the Buffered mode according to the embodiment of the present invention.

FIGS. 19A and 19B are views describing the Buffered mode according to the embodiment of the present invention.

With reference to FIG. 19A, the Buffered mode is a mode in which two FBs are connected in series by directly coupling the Axis output terminal of the FB on the preceding side (left side) and the Axis input terminal of the FB on the following side (right side), and ON (value of 1) is input to the Execute terminal of the FB on the following side to have the FB on the following side in the Busy state during the execution of the FB on the preceding side. The FB on the following side, which is set to the Busy state in advance, becomes Active from the control period after the control period in which the FB on the preceding side completes the execution, and starts the calculation of the command value.

The Buffered mode is specified by inputting "Buffered" to the BufferMode terminal of the FB on the following side.

Even if another further FB is connected in series to the back of the FB on the following side, the Buffered mode can be specified on such FB as well.

With reference to FIG. 19B, a timing chart of the input signal and the output signal for the terminal of one part of the FB in the Buffered mode is shown.

A case where the FB1 is started at time t1 to be in the Busy state and the Active state is shown. A case where the FB2 is started at time t2 to be in the Busy state is also shown. A case where the FB2 becomes the Active state at time t3 is further shown.

When both the "Active ON of FB" and the "Busy ON of FB" are specified for the setting method of the resumable point, the control period corresponding to times t1, t2, and t3 of the graph becomes resumable points.

Figure 20:
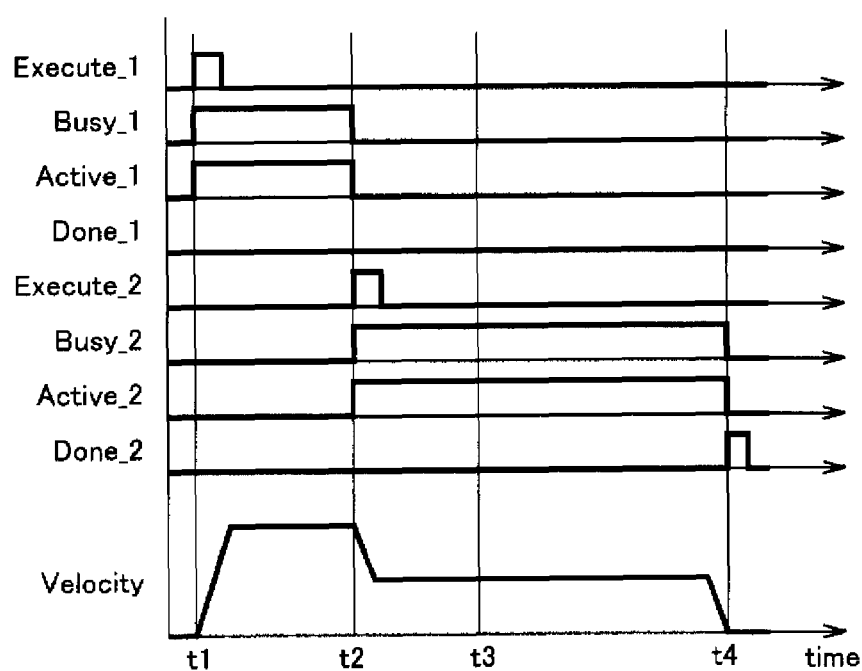
FIG. 20 is a view describing a timing chart of the input signal and the output signal for the terminal of one part of the FB in the Aborting mode according to the embodiment of the present invention.

FIG. 20 is a view describing a timing chart of the input signal and the output signal for the terminal of one part of the FB in the Aborting mode according to the embodiment of the present invention.

When "Aborting" is input to the BufferMode terminal of the FB on the following side with two FBs connected in series in FIG. 19A, the Aborting mode is realized. In the Aborting mode, when ON (value of 1) is input to the Execute terminal of the FB on the following side during the execution of the FB on the preceding side, the execution of the FB on the preceding side is immediately canceled, and the FB on the following side becomes Active in the next control period thus starting to calculate the command value. Even if another further FB is connected in series to the back of the FB on the following side, the Aborting mode can be specified on such FB as well.

When both the "Active ON of FB" and the "Busy ON of FB" are specified for the setting method of the resumable point, the control period corresponding to times t1 and t2 of the graph becomes the resumable point. Time t3, at which the FB on the following side started execution in the case of the Buffered mode, does not becomes the resumable point in the Aborting mode.

The Blending mode will now be described. The Blending mode is common with the Buffered mode in that the FB on the preceding side completes the execution without being canceled, but the velocity does not become zero once as in the Buffered mode, and shift is made from the state in which the FB on the preceding side is Active to the state in which the FB on the following side is Active while continuing the movement in the relay velocity. The Blending mode has four modes, BlendingNext mode, BlendingPrevious mode, BlendingHigh mode, and Blending Low mode, depending on the way the relay velocity is determined.

Figure 21:
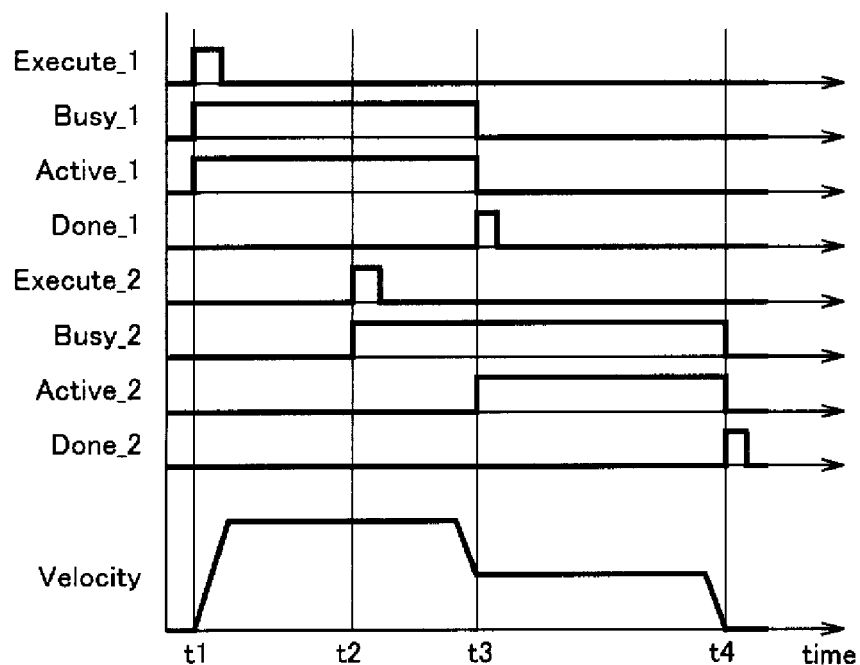
FIG. 21 is a view showing a timing chart of the input signal and the output signal for the terminal of one part of the FB in the BlendingNext mode according to the embodiment of the present invention.

FIG. 21 is a view showing a timing chart of the input signal and the output signal for the terminal of one part of the FB in the BlendingNext mode according to the embodiment of the present invention.

When "BlendingNext" is input to the BufferMode terminal of the FB on the following side with two FBs connected in series in FIG. 19A, the BlendingNext mode is realized.

In the BlendingNext mode, when ON (value of 1) is input to the Execute terminal of the FB on the following side during the execution of the FB on the preceding side, the command value calculation content of the FB on the preceding side is adjusted so that the terminating velocity of the FB on the preceding side becomes the target velocity of the FB on the following side. The FB on the following side that is in the Busy state in advance becomes Active from the control period after the control period in which the FB on the preceding side completed the execution, and starts the calculation of the command value.

Even if another further FB is connected in series to the back of the FB on the following side, the BlendingNext mode can be specified on such FB as well.

If both the "Active ON of FB" and the "Busy ON of FB" are specified for the setting method of the resumable point, the control periods corresponding to times t1, t2, and t3 of the graph become resumable points.

Figure 22:
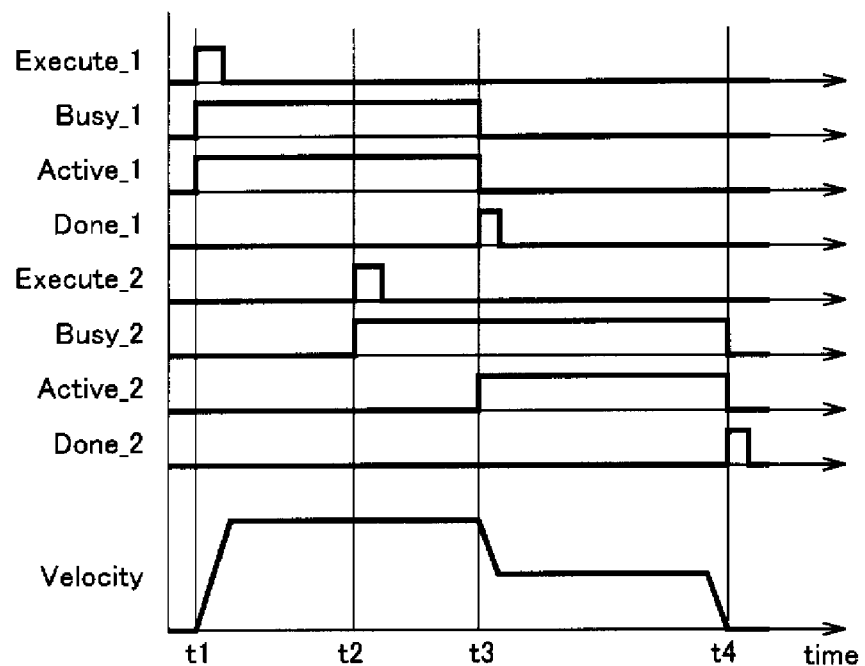
FIG. 22 is a view showing a timing chart of the input signal and the output signal for the terminal of one part of the FB in the BlendingPrevious mode according to the embodiment of the present invention.

FIG. 22 is a view showing a timing chart of the input signal and the output signal for the terminal of one part of the FB in the BlendingPrevious mode according to the embodiment of the present invention.

When "BlendingPrevious" is input to the BufferMode terminal of the FB on the following side with two FBs connected in series in FIG. 19A, the BlendingPrevious mode is realized.

In the BlendingPrevious mode, when ON (value of 1) is input to the Execute terminal of the FB on the following side during the execution of the FB on the preceding side, the command value calculation content of the FB on the preceding side is adjusted so that the FB on the preceding side maintains the target velocity until the completion of the execution. The FB on the following side that is in the Busy state in advance becomes Active from the control period after the control period in which the FB on the preceding side completed the execution, and starts the calculation of the command value.

Even if another further FB is connected in series to the back of the FB on the following side, the BlendingPrevious mode can be specified on such FB as well.

If both the "Active ON of FB" and the "Busy ON of FB" are specified for the setting method of the resumable point, the control periods corresponding to times t1, t2, and t3 of the graph become resumable points.

When "BlendingHigh" is input to the BufferMode terminal of the FB on the following side with two FBs connected in series in FIG. 19A, the BlendingHigh mode is realized. In the BlendingHigh mode, the greater one of the target velocity of the FB on the preceding side or the target velocity of the FB on the following side becomes the relay velocity. In other words, the operation when the target velocity of the FB on the preceding side is greater is the same as the operation of the BlendingPrevious mode, and the operation when the target velocity of the FB on the preceding side is smaller is the same as the operation of the BlendingNext mode.

When "BlendingLow" is input to the BufferMode terminal of the FB on the following side with two FBs connected in series in FIG. 19A, the BlendingLow mode is realized. In the BlendingLow mode, the smaller one of the target velocity of the FB on the preceding side or the target velocity of the FB on the following side becomes the relay velocity. In other words, the operation when the target velocity of the FB on the preceding side is greater is the same as the operation of the BlendingNext mode, and the operation when the target velocity of the FB on the preceding side is smaller is the same as the operation of the Blending Previous mode.

The motion function block for specifying the target position with the absolute coordinate for one axis has been described above by way of example, but the motion function block has different types such as that for specifying the target position with the relative coordinate from the position at the start of execution of the FB, that for grouping a plurality of axes and synchronizing the moving start and moving end timing of each axis included in the group and the velocity control in the middle to be linearly moved between two points within the two-dimensional space or the three-dimensional space, and that for moving between the two points while drawing an arcuate trajectory. Needless to say, the present invention can be applied to any case.

A method of functioning the computer to execute the control described in the above flow or a program for realizing such method may also be provided. Such program may be recorded in a non-temporary computer readable recording medium such as a flexible disc, a CD-ROM (Compact Disk-Read Only Memory), a ROM (Read Only Memory), a RAM (Random Access Memory) and a memory card attached to the computer, and provided as a program product. Alternatively, the program may be provided by being recorded in a recording medium such as a hard disc incorporated in the computer. The program may also be provided by being downloaded through the network.

The program may call out the necessary module, of the program module provided as one part of the operation system (OS) of the computer, at a predetermined array and at a predetermined timing, and process such necessary module. In such a case, the relevant module is not included in the program itself, and the process is executed in cooperation with the OS. The program that does not include such module is also encompassed within the program according to the present invention.

The program according to the present invention may be provided by being incorporated in one part of another program. In this case as well, the module of another program is not included in the program itself, and the process is executed in cooperation with another program. The program incorporated in another program is also encompassed within the program according to the present invention.

The program product to be provided is installed in a program storage section such as a hard disc to be executed. The program product includes the program itself, and the recording medium on which the program is recorded.

The embodiment of the present invention has been described above, but the embodiment disclosed herein is illustrative in all aspects and should not be construed as being restrictive. The scope of the present invention is defined by the Claims, where meanings equivalent to the Claims and all modifications within the scope of the Claims are to be encompassed herein.

DESCRIPTION OF SYMBOLS 2 server
4 network
8 controller support program
10, 15 control program
14 controller
16 control target device
17 motor driver
18 motor
50 XYZ guide
60 vacuum adsorption chuck
70 IC tray
75 IC tray conveyor
80 IC chip conveyor
100 IC chip transfer device
802 user interface unit
804 display data creating unit
806 simulation unit
808 control program storage unit
810 control program editing unit
812 controller interface unit
820 simulation control section
822 debug assisting section
824 control period counting section
826 resuming data storage section
828 resuming data buffer
830 execution result data storage section
840 sequence control simulation section
842 sequence calculation control part
844 sequence calculation executing part
846 sequence variable storage part
850 motion control simulation section
852 motion calculation control part
854 motion calculation executing part
856 motion variable storage part

The invention claimed is:

1. A controller support device for simulation of a control program including a sequence control portion and a motion control portion executed for every control period in a controller for controlling movement of a machine, the controller support device including a computer comprising:
  a simulation unit configured for simulating execution of the control program and generating execution result data;
  a display data creating unit configured for creating display data for displaying temporal change in the execution result data generated by the simulation unit;
  an accepting unit configured for accepting an instruction of a user on the simulation unit; and
  a display for displaying the display data created by the display data creating unit;
  wherein the simulation unit includes:
  a sequence calculation executing part configured for simulating execution of the sequence control portion of the control program and generating execution result data related to the sequence control portion;
  a sequence variable storage part configured to be used by the sequence calculation executing part for executing the simulation;
  a motion calculation executing part configured for simulating execution of the motion control portion of the control program and generating execution result data related to the motion control portion;
  a motion variable storage part configured to be used by the motion calculation executing part for simulating execution;
  a control period counting section configured for counting a number of executions of a control period;
  a resuming data storage section configured for saving resuming data, the resuming data including data of the number of executions corresponding to a resumable control period in which re-execution of the simulation can be started, sequence variable data used to start the re-execution of the simulation from the resumable control period of the data stored in the sequence variable storage part and the motion variable storage part, and motion variable data used to start the re-execution of the simulation from the resumable control period of the data stored in the motion variable storage part; and a resuming data buffer for temporarily saving the resuming data being stored in the resuming data storage section, wherein the simulation unit: determines that the control period is the resumable control period, a previous resuming data corresponding to the resumable control period saved in the resuming data buffer is stored in the resuming data storage section and if the simulation unit determines that the control period is not the resumable control period, the resuming data buffer is updated based on the execution result data generated in the sequence calculation executing part and the motion calculation executing part; and wherein the simulation unit acquires a specification for specifying the control period to start the re-execution from the accepting unit, specifies the control period to start the re-execution using the specification, and starts the re-execution of the simulation from the specified control period to control the movement of the machine with the controller using the resuming data stored in the resuming data storage section and corresponding to the specified control period.

2. The controller support device according to claim 1, further comprising:

a control program editing unit configured for editing the control program; wherein the control program editing unit is configured to accept an operation of the user to correct the control program simulation executed in the simulation unit; and the simulation unit is configured to accept an operation of the user to start the re-execution of the simulation using the resuming data saved before the control program is corrected for the control program corrected by the control program editing unit.

3. The controller support device according to claim 2, wherein the control program editing unit is configured to correct the motion control portion of the control program by the operation of the user; and the simulation unit is configured to acquire information for specifying the corrected motion control portion from the control program editing unit, specify the control period in which re-execution can be carried out from the most recently corrected motion control portion from the resumable control periods, and start the re-execution of the simulation from the control period.

4. The controller support device according to claim 2, wherein the control program editing unit is configured to list display content of the control program on the display;

the accepting unit is configured to accept specification of the motion control portion to start the re-execution on the list display; and the simulation unit is configured to specify a control period in which re-execution can be carried out from the specified motion control portion from the resumable control periods, and to start the re-execution of the simulation from the control period.

5. The controller support device according to claim 1, wherein the motion control portion of the control program is in either an active state which is a state of calculating a command value, or an inactive state which is not the active state, in each control period; and the simulation unit is configured to specify the resumable control period with the control period in which the motion control portion becomes the active state from the inactive state as a reference.

6. The controller support device according to claim 1, wherein the motion control portion of the control program is in either an executing state in which the motion control portion is in execution, or a non-executing state which is not the executing state, in each control period; and the simulation unit is configured to specify the resumable control period with the control period in which the motion control portion becomes the executing state from the non-executing state as a reference.

7. The controller support device according to claim 1, wherein the simulation unit is configured to specify the control period for every constant interval as the resumable control period.

8. The controller support device according to claim 1, wherein the display data creating unit is configured to create the display data for displaying the temporal change in the execution result data as a graph;

the accepting unit is configured to accept the instruction of the user on a position on the graph displayed on the display; and the simulation unit is configured to specify a control period corresponding to the position on the graph instructed by the user from the resumable control periods, and to start re-execution of the simulation from the control period.

9. The controller support device according to claim 1, wherein the display data creating unit is configured to create display data for displaying the temporal change in the execution result data for the position generated by the simulation unit as a trajectory in a two-dimensional space or a three-dimensional space;

the accepting unit is configured to accept the instruction of the user on the position on the trajectory; and the simulation unit is configured to specify a control period corresponding to the position on the trajectory instructed by the user from the resumable control periods, and to start re-execution of the simulation from the control period.

10. The controller support device according to claim 1, wherein the display data creating unit is configured to create display data for displaying the temporal change in the execution result data as a list of positions;

the accepting unit is configured to accept the instruction of the user on the position in the list of positions displayed on the display; and the simulation unit is configured to specify a control period corresponding to the position in the list of positions instructed by the user from the resumable control periods, and to start re-execution of the simulation from the control period.

11. A simulation method of a control program for simulation in a controller support device including a display a control program, including a sequence control portion and a motion control portion, executed for every control period in a controller for controlling movement of a machine, the simulation method of the control program comprising:
- simulating execution of the control program according to an instruction of a user, and generating execution result data;
- creating display data for displaying temporal change in the execution result data; and
- displaying the display data created on the display;
- wherein simulating execution of the control program includes:
- simulating execution of the sequence control portion of the control program and generating execution result data related to the sequence control portion;
- simulating execution of the motion control portion of the control program and generating execution result data related to the motion control portion;
- counting number of executions of a control period;
- determining whether the control period is a resumable control period, which is a control period in which re-execution of the simulation can be started;
- saving resuming data, the resuming data including data on the number of executions corresponding to the resumable control period, sequence variable data used to start the re-execution of the simulation from the resumable control period of sequence variable data associated with the execution of the sequence control portion, and motion variable data used to start the re-execution of the simulation from the resumable control period of motion variable data associated with the execution of the motion control portion, wherein resuming data corresponding to a previous resumable control period is stored if the control period is determined to be the resumable control period;
- wherein simulating execution of the control program further includes updating the resuming data based on the execution result data if the control period is determined not to be the resumable control period; and
- accepting a specification by the user for specifying the control period to start the re-execution, specifying the control period to start the re-execution using the specification, and starting the re-execution of the simulation from the specified control period to control the movement of the machine with the controller using the resuming data stored while saving the resuming data corresponding to the specified control period.

12. A non-transitory computer readable storage medium storing a support program of a controller for simulation in a controller support device including a display a control program, including a sequence control portion and a motion control portion, executed for every control period in a controller for controlling movement of a machine, wherein the control program causes the controller support device to execute:
- simulating execution of the control program according to an instruction of a user, and generating execution result data;
- creating display data for displaying temporal change in the execution result data generated; and
- the display data created on the display;
- wherein simulating execution of the control program includes:
- simulating execution of the sequence control portion of the control program and generating execution result data related to the sequence control portion;
- simulating execution of the motion control portion of the control program and generating execution result data related to the motion control portion;
- counting number of executions of a control period;
- determining whether the control period is a resumable control period, which is a control period in which re-execution of the simulation can be started;
- saving resuming data, the resuming data including data on the number of executions corresponding to the resumable control period, sequence variable data used to start the re-execution of the simulation from the resumable control period of sequence variable data associated with the execution of the sequence control portion, and motion variable data used to start the re-execution of the simulation from the resumable control period of motion variable data associated with the execution of the motion control portion, wherein saving the resuming data includes storing resuming data corresponding to a previous resumable control period if the control period is determined to be the resumable control period;
- updating resuming data based on the execution result data if the control period is determined not to be the resumable control period; and
- accepting a specification by the user for specifying the control period to start the re-execution, specifying the control period to start the re-execution using the specification, and starting the re-execution of the simulation from the specified control period to control the movement of the machine with the controller using the stored resuming data and corresponding to the specified control period.

* * * * *